(12) United States Patent
Chiang et al.

(10) Patent No.: US 10,818,552 B2
(45) Date of Patent: *Oct. 27, 2020

(54) METHOD AND APPARATUS FOR PLASMA DICING A SEMI-CONDUCTOR WAFER

(71) Applicant: Plasma-Therm LLC, St. Petersburg, FL (US)

(72) Inventors: Tsu-Wu Chiang, Milpitas, CA (US); Russell Westerman, Land O' Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/279,560

(22) Filed: Feb. 19, 2019

(65) Prior Publication Data

US 2019/0189513 A1    Jun. 20, 2019

Related U.S. Application Data

(62) Division of application No. 15/824,166, filed on Nov. 28, 2017, now Pat. No. 10,269,641.

(60) Provisional application No. 62/428,078, filed on Nov. 30, 2016.

(51) Int. Cl.
| H01L 21/78 | (2006.01) |
| H01J 37/32 | (2006.01) |
| H01L 21/3065 | (2006.01) |
| H01L 21/683 | (2006.01) |
| H01L 23/31 | (2006.01) |

(52) U.S. Cl.
CPC ........ H01L 21/78 (2013.01); H01J 37/32477 (2013.01); H01J 37/32715 (2013.01); H01L 21/3065 (2013.01); H01L 21/6831 (2013.01); H01L 21/6836 (2013.01); H01L 23/3171 (2013.01); *H01L 2221/68327* (2013.01)

(58) Field of Classification Search
CPC .............. H01L 21/3065; H01L 21/6831; H01L 21/6836; H01L 21/78; H01L 23/3171
See application file for complete search history.

(56) References Cited

U.S. PATENT DOCUMENTS

2014/0242780 A1*   8/2014   Gauldin ............. H01L 21/3065
                                                                     438/463

* cited by examiner

*Primary Examiner* — Bilkis Jahan
*Assistant Examiner* — Victor V Barzykin
(74) *Attorney, Agent, or Firm* — Burr & Forman LLP; Harvey S. Kauget

(57) ABSTRACT

The present invention provides a method for plasma dicing a substrate. The substrate is provided with a top surface and a bottom surface, the top surface of the substrate having a plurality of street areas and at least one device structure. The substrate is placed onto a support film on a frame to form a work piece. A process chamber having a plasma source is provided. A work piece support is provided within the plasma process chamber. The work piece is placed onto the work piece support. A plasma is generated from the plasma source in the plasma process chamber. The work piece is processed using the generated plasma and a byproduct generated from the support film while the support film is exposed to the generated plasma.

26 Claims, 25 Drawing Sheets

FIG. 20
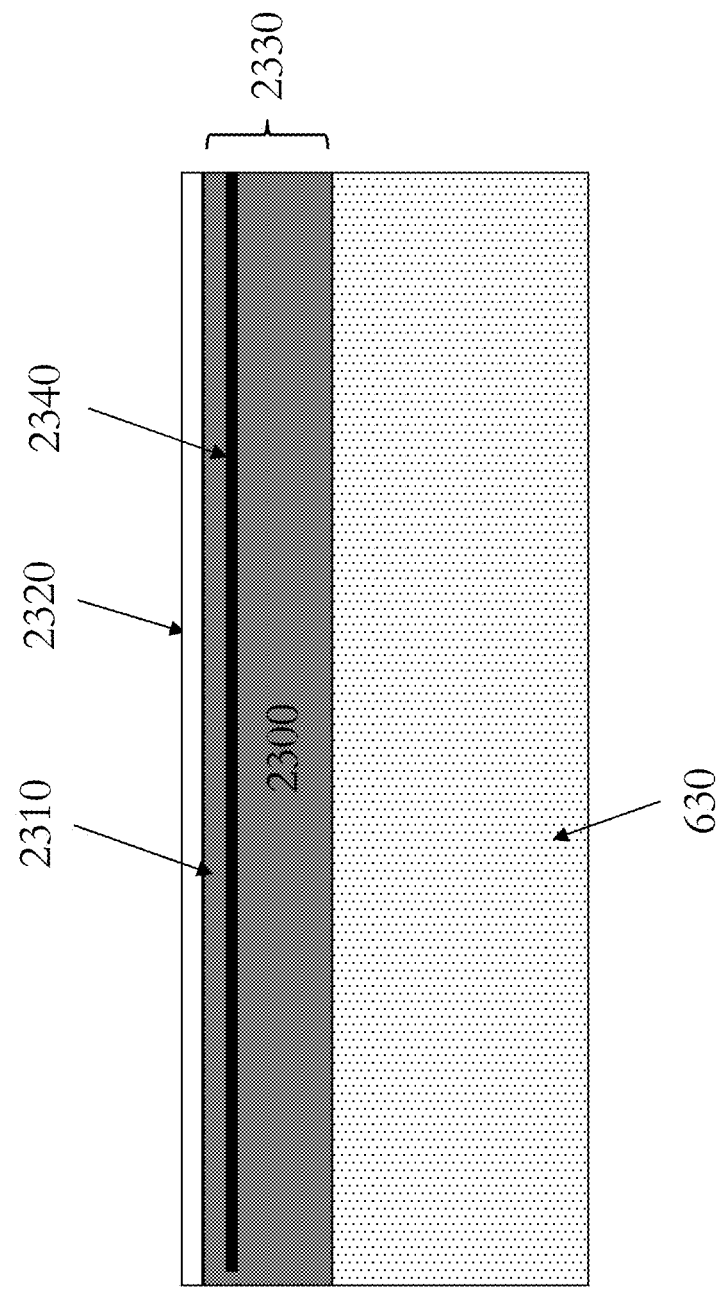
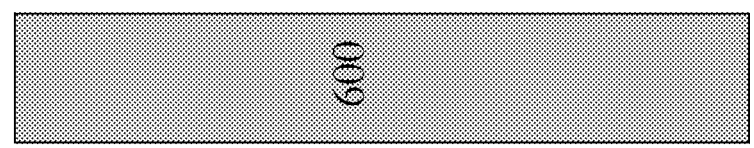

METHOD AND APPARATUS FOR PLASMA DICING A SEMI-CONDUCTOR WAFER

CROSS REFERENCES TO RELATED APPLICATIONS

This utility patent application is a division of commonly owned U.S. Utility patent application Ser. No. 15/824,166 entitled: METHOD AND APPARATUS FOR PLASMA DICING A SEMI-CONDUCTOR WAFER filed Nov. 28, 2017, which was filed based on commonly owned U.S. Provisional Patent Application Ser. No. 62/428,078 filed Nov. 30, 2016 entitled: METHOD AND APPARATUS FOR PLASMA DICING A SEMI-CONDUCTOR WAFER, these Patent Applications incorporated by reference herein.

FIELD OF THE INVENTION

The invention relates to the use of an apparatus for the formation of individual device chips from a semi-conductor wafer, and in particular to an apparatus which uses plasma etching to separate the wafer into individual die.

BACKGROUND

Semi-conductor devices are fabricated on substrates which are in the form of thin wafers. Silicon is commonly used as the substrate material, but other materials, such as III-V compounds (for example GaAs and InP) are also used. In some instances (for example, the manufacture of LED's) the substrate is a sapphire or silicon carbide wafer on which a thin layer of a semi-conducting material is deposited. The diameter of such substrates range from 2 inches and 3 inches up to 200 mm, 300 mm, and 450 mm and many standards exist (e.g., SEMI) to describe such substrate sizes.

Plasma etching equipment is used extensively in the processing of these substrates to produce semi-conductor devices. Such equipment typically includes a vacuum chamber fitted with a high density plasma source such as Inductively Coupled Plasma (ICP) which is used to ensure high etch rates, necessary for cost-effective manufacturing. In order to remove the heat generated during the processing, the substrate is typically clamped to a temperature controlled support. A pressurized fluid, typically a gas such as Helium is maintained between the substrate and the support to provide a thermal conductance path for heat transfer. A mechanical clamping mechanism, in which a downward force is applied to the top side of the substrate, may be used, though this may cause contamination due to the contact between the clamp and the substrate. Work piece bowing may also occur when using a mechanical clamp, since contact is typically made at the edge of the work piece and a pressurized fluid exerts a force on the back of the work piece. More frequently an electrostatic chuck (ESC) is used to provide the clamping force.

Numerous gas chemistries appropriate to the material to be etched have been developed. These frequently employ a halogen (Fluorine, Chlorine, Bromine, or Iodine) or halogen-containing gas together with additional gases added to improve the quality of the etch (for example, etch anisotropy, mask selectivity and etch uniformity). Fluorine containing gases, such as $SF_6$, $F_2$, $ClF_3$ and/or $NF_3$, can be used to etch silicon at a high rate. In particular, a process (Bosch or TDM) which alternates a high rate silicon etch step with a passivation step to control the etch sidewall, is commonly used to etch deep features into silicon. Chlorine, Iodine, and/or Bromine containing gases are commonly used to etch III-V materials.

Plasma etching is not limited to semiconducting substrates and devices. The technique may be applied to any substrate type where a suitable gas chemistry to etch the substrate is available. Other substrate types may include carbon containing substrates (including polymeric substrates), ceramic substrates (e.g., AlTiC and sapphire), metal substrates, glass substrates, and die attach films To ensure consistent results, low breakage and ease of operation, robotic wafer handling is typically used in the manufacturing process. Handlers are designed to support the wafers with minimal contact, to minimize possible contamination and reduce the generation of particulates. Edge contact alone, or underside contact close to the wafer edge at only a few locations (typically within 3-6 mm of the wafer edge), is generally employed. Handling schemes, which include wafer cassettes, robotic arms and within process chamber fixtures including the wafer support and ESC, are designed to handle the standard wafer sizes as noted previously.

After fabrication on the substrate, the individual devices (die or chips) are separated from each other prior to packaging or being employed in other electronic circuitry. For many years, mechanical means have been used to separate the die from each other. Such mechanical means have included breaking the wafer along scribe lines aligned with the substrate crystal axis or by using a high speed diamond saw to saw into or through the substrate in a region (streets) between the die. More recently, lasers have been used to facilitate the scribing process.

Such mechanical wafer dicing techniques have limitations which affect the cost effectiveness of this approach. Chipping and breakage along the die edges can reduce the number of good die produced, and becomes more problematic as wafer thicknesses decrease. The area consumed by the saw bade (kerf) may be greater than 100 microns which is valuable area not useable for die production. For wafers containing small die (e.g., individual semiconductor devices with a die size of 500 microns by 500 microns) this can represent a loss of greater than 20%. Further, for wafers with many small die and hence numerous streets, the dicing time is increased, and productivity decreased, since each street is cut individually. Mechanical means are also limited to separation along straight lines and the production of square or oblong shaped chips. This may not represent the underlying device topology (e.g., a high power diode is round) and so the rectilinear die format results in significant loss of useable substrate area. Laser dicing also has limitations by leaving residual material on the die surface or inducing stress into the die.

It is important to note that both sawing and laser dicing techniques are essentially serial operations. Consequently, as device sizes decrease, the time to dice the wafer increases in proportion to the total dicing street length on the wafer.

Recently plasma etching techniques have been proposed as a means of separating die and overcoming some of these limitations. After device fabrication, the substrate is masked with a suitable mask material, leaving open areas between the die. The masked substrate is then processed using a reactive-gas plasma which etches the substrate material exposed between the die. The plasma etching of the substrate may proceed partially or completely through the substrate. In the case of a partial plasma etch, the die are separated by a subsequent cleaving step, leaving the individual die separated. The technique offers a number of benefits over mechanical dicing:

1) Breakage and chipping is reduced;
2) The kerf dimensions can be reduced to well below 20 microns;
3) Processing time does not increase significantly as the number of die increases;
4) Processing time is reduced for thinner wafers; and
5) Die topology is not limited to a rectilinear format.

After device fabrication, but prior to die separation, the substrate may be thinned by mechanical grinding or similar process down to a thickness of a few hundred microns, or even less than a hundred microns.

Prior to the dicing process, the substrate is typically mounted on a dicing fixture. This fixture is typically comprised of a rigid frame that supports an adhesive membrane. The substrate to be diced is adhered to the membrane. This fixture holds the separated die for subsequent downstream operations. Most tools used for wafer dicing (saws or laser based tools) are designed to handle substrates in this configuration and a number of standard fixtures have been established; however, such fixtures are very different from the substrates which they support. Though such fixtures are optimized for use in current wafer dicing equipment, they cannot be processed in equipment which has been designed to process standard substrates. Thus, current automated plasma etching equipment is not suitable for processing substrates fixtured for dicing and it is difficult to realize the benefits that plasma etch techniques should have for die separation.

Therefore, what is needed is a plasma etching apparatus which can be used for dicing a semiconductor substrate into individual die and which is compatible with the established wafer dicing technique of handling a substrate mounted on tape and supported in a frame, and which is also compatible with standard front side masking techniques.

Nothing in the prior art provides the benefits attendant with the present invention. Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method of dicing a substrate, the method comprising: providing a plasma process chamber having a plasma source; providing a work piece support within the plasma process chamber; providing the substrate having a top surface and a bottom surface, the top surface of the substrate having a plurality of street areas and at least one device structure; placing the substrate onto a support film on a frame to form a work piece; placing the work piece onto said work piece support; generating a plasma from the plasma source in the plasma process chamber; and processing the work piece using the generated plasma and a byproduct generated from the support film while the support film is exposed to the generated plasma.

Yet another object of the present invention is to provide a method of dicing a substrate, the method comprising: providing a plasma process chamber having a plasma source; providing a work piece support within the plasma process chamber; providing the substrate having a top surface and a bottom surface, the top surface of the substrate having a plurality of street areas and at least one device structure; placing the substrate onto a support film on a frame to form a work piece; placing the work piece onto said work piece support; generating a plasma from the plasma source in the plasma process chamber; etching a surface of the substrate of the work piece using the generated plasma to removed material from the surface of the substrate and provide exposed surfaces; and depositing a passivation layer comprising a byproduct generated from the support film that is exposed to the generated plasma onto the surfaces that were exposed in the etching step.

Still yet another object of the present invention is to provide a method of dicing a substrate, the method comprising: providing a plasma process chamber having a plasma source; providing a work piece support within the plasma process chamber; providing the substrate having a top surface and a bottom surface, the top surface of the substrate having a plurality of street areas and at least one device structure; placing the substrate onto a support film on a frame to form a work piece; placing the work piece onto said work piece support; generating a plasma from the plasma source in the plasma process chamber; and etching a surface of the substrate of the work piece using a plasma etch gas and a byproduct generated from the support film that is exposed to the generated plasma to removed material from the surface of the substrate and provide exposed surfaces.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a plasma processing apparatus which allows for plasma dicing of a semiconductor substrate. After device fabrication and wafer thinning, the front side (circuit side) of the substrate is masked using conventional masking techniques which protects the circuit components and leaves unprotected areas between the die. The substrate is mounted on a thin tape which is supported within a rigid frame. The substrate/tape/frame assembly is transferred into a vacuum process chamber and exposed to reactive gas plasma where the unprotected areas between the die are etched away. During this process, the frame and tape are protected from damage by the reactive gas plasma. The processing leaves the die completely separated. After etching, the substrate/tape/frame assembly is additionally exposed to plasma which removes potentially damaging residues from the substrate surface. After transfer of the substrate/tape/frame assembly out of the process chamber, the die are removed from the tape using well known techniques and are then further processed (e.g., packaged) as necessary.

Another feature of the present invention is to provide a method for plasma dicing a substrate. The substrate can have a semiconducting layer such as Silicon and/or the substrate can have a III-V layer such as GaAs. The substrate can have a protective layer such as a photoresist layer that is patterned on a circuit side of the substrate. The substrate is provided with a top surface and a bottom surface, the top surface of the substrate having a plurality of street areas and at least one device structure. The at least one of the plurality of streets of the substrate can intersect at an edge of the substrate. The substrate is placed onto a support film on a frame to form a work piece. The substrate can be adhered to the support film. The support film can further comprise a carbon containing layer. The support film can further comprise a plurality of layers. The support film can further comprise an adhesive layer. The frame of the work piece can have a conductive layer and/or a metal layer. A process chamber having a plasma source is provided. The plasma source can be a high density plasma source. A work piece support is provided within the plasma process chamber. An electrostatic chuck can be incorporated into the work piece support. The work piece is placed onto the work piece support. An RF power source can be coupled to the work piece support to create a plasma around the work piece. A thermal communication between the work piece and the work piece support can be provided by supplying a pressurized gas such as helium from the work piece support to the work piece. A plasma is generated from the plasma source in the plasma process chamber. The work piece is processed using the generated plasma and a byproduct generated from the support film while the support film is exposed to the generated plasma. The at least one device structure on the substrate can be protected during the processing step.

Yet another feature of the present invention is to provide a method for plasma dicing a substrate. The substrate can have a semiconducting layer such as Silicon and/or the substrate can have a III-V layer such as GaAs. The substrate can have a protective layer such as a photoresist layer that is patterned on a circuit side of the substrate. The substrate is provided with a top surface and a bottom surface, the top surface of the substrate having a plurality of street areas and at least one device structure. The at least one of the plurality of streets of the substrate can intersect at an edge of the substrate. The substrate is placed onto a support film on a frame to form a work piece. The substrate can be adhered to the support film. The support film can further comprise a carbon containing layer. The support film can further comprise a plurality of layers. The support film can further comprise an adhesive layer. The frame of the work piece can have a conductive layer and/or a metal layer. A process chamber having a plasma source is provided. The plasma source can be a high density plasma source. A work piece support is provided within the plasma process chamber. An electrostatic chuck can be incorporated into the work piece support. The work piece is placed onto the work piece support. An RF power source can be coupled to the work piece support to create a plasma around the work piece. A thermal communication between the work piece and the work piece support can be provided by supplying a pressurized gas such as helium from the work piece support to the work piece. A plasma is generated from the plasma source in the plasma process chamber. A surface of the substrate of the work piece is etched using the generated plasma to removed material from the surface of the substrate and provide exposed surfaces. The etching step can be an anisotropic etch. A passivation layer comprising a byproduct generated from the support film that is exposed to the generated plasma is deposited onto the surfaces that were exposed in the etching step. The at least one device structure on the substrate can be protected during the etching step.

Still yet another feature of the present invention is to provide a method for plasma dicing a substrate. The substrate can have a semiconducting layer such as Silicon and/or the substrate can have a III-V compound semiconductor-containing layer such as GaAs. The substrate can have a protective layer such as a photoresist layer that is patterned on a circuit side of the substrate. The substrate is provided with a top surface and a bottom surface, the top surface of the substrate having a plurality of street areas and at least one device structure. The at least one of the plurality of streets of the substrate can intersect at an edge of the substrate. The substrate is placed onto a support film on a frame to form a work piece. The substrate can be adhered to the support film. The support film can further comprise a carbon containing layer. The support film can further comprise a plurality of layers. The support film can further comprise an adhesive layer. The frame of the work piece can have a conductive layer and/or a metal layer. A process chamber having a plasma source is provided. The plasma source can be a high density plasma source. A work piece support is provided within the plasma process chamber. An electrostatic chuck can be incorporated into the work piece support. The work piece is placed onto the work piece support. An RF power source can be coupled to the work piece support to create a plasma around the work piece. A thermal communication between the work piece and the work piece support can be provided by supplying a pressurized gas such as helium from the work piece support to the work piece. A plasma is generated from the plasma source in the plasma process chamber. A surface of the substrate of the work piece is etched using a plasma etch gas and a byproduct generated from the support film that is exposed to the generated plasma to removed material from the surface of the substrate and provide exposed surfaces. The at least one device structure on the substrate can be protected during the etching step.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 20 is a cross-sectional view of an electrostatic chuck according to one embodiment of the present invention;

Similar reference characters refer to similar parts throughout the several views of the drawings.

DETAILED DESCRIPTION OF THE INVENTION

Figure 1:
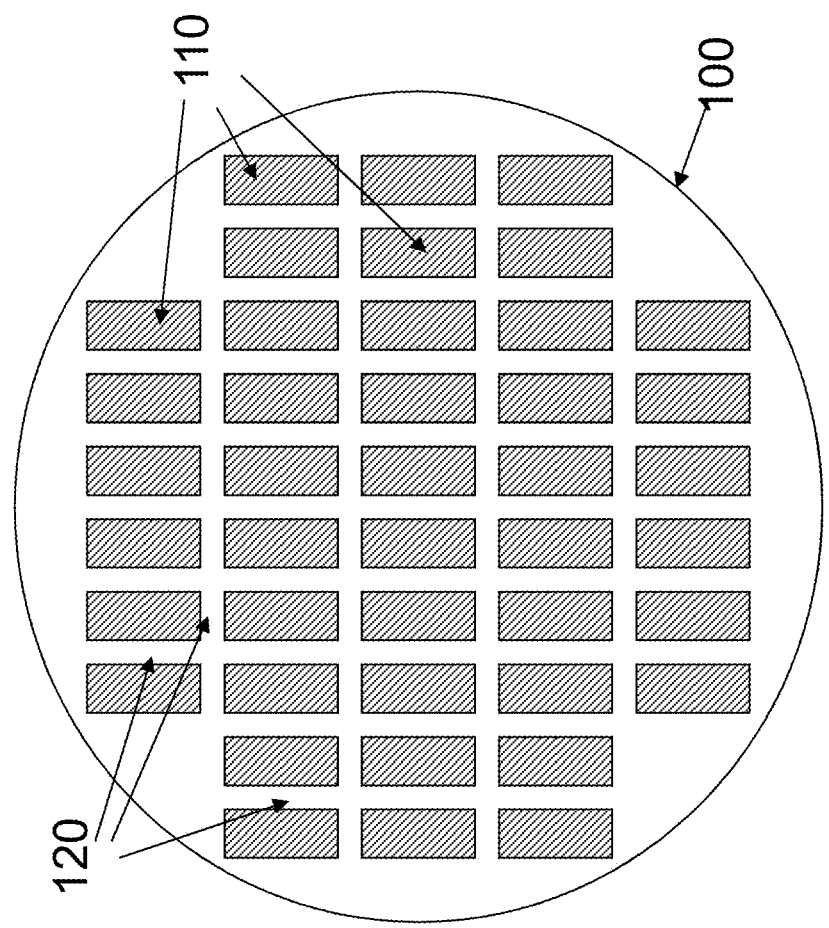
FIG. 1 is a top down view of a semiconductor substrate illustrating individual devices separated by streets.

A typical semiconductor substrate after device fabrication is illustrated in FIG. 1. The substrate (100) has on its surface a number of areas containing device structures (110) separated by street areas (120) which allows for separation of the device structures into individual die. Although silicon is commonly used as a substrate material, other materials chosen for their particular characteristics are frequently employed. Such substrate materials include Gallium Arsenide and other III-V materials or non-semi-conductor substrates on which a semi-conducting layer has been deposited. Further substrate types may also include Silicon-On-Insulator (SOI) wafers and semiconductor wafers mounted on carriers. While the example above describes die separated by streets, aspects of the invention may be beneficially applied to other pattern configurations on a substrate including substrates containing Gallium, substrates containing Indium, substrates containing Aluminum, substrates containing epitaxial layers, substrates containing carbon, substrates that are polymeric, substrates containing a semiconductor and/or substrates containing multiple semiconductors.

Figure 2:
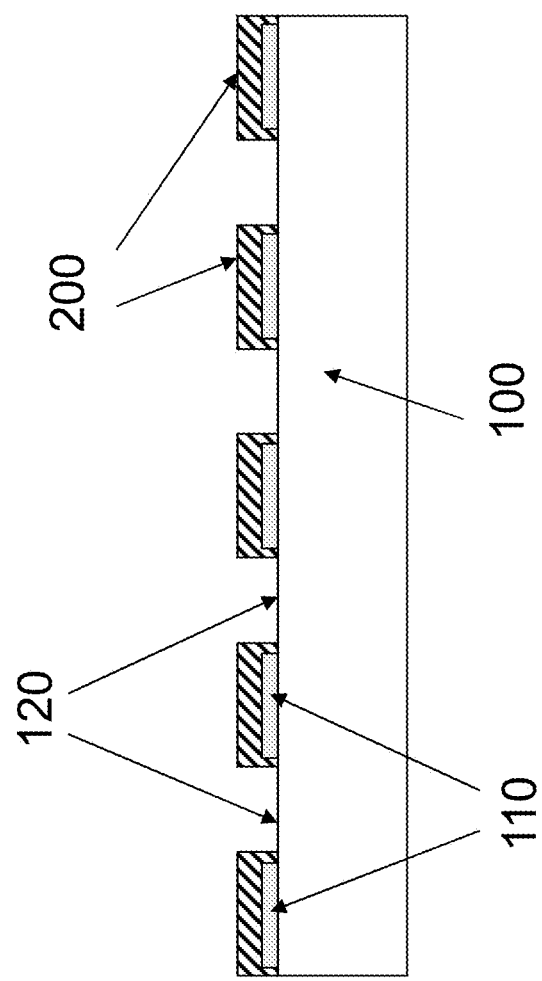
FIG. 2 is a cross-sectional view of a semiconductor substrate illustrating individual devices separated by streets.

In the present invention, as is shown in a cross sectional view in FIG. 2, the device structures (110) are then covered with a protective material (200) while the street areas (120) remain unprotected. This protective material (200) can be a photoresist, applied and patterned by well-known techniques. Some devices, as a final process step are coated with a protective dielectric layer such as silicon dioxide or PSG which is applied across the whole substrate. This can be selectively removed from the street areas (120) by patterning with photoresist and etching the dielectric material, as is well known in the industry. This leaves the device structures (110) protected by the dielectric material and the substrate (100) substantially unprotected in the street areas (120). Note that in some cases test features to check the wafer quality may be located in the street areas (120). Depending on the specific wafer fabrication process flow, these test features may or may not be protected during the wafer dicing process. Although the device pattern illustrated shows oblong die, this is not necessary, and the individual device structures (110) may be any other shape, such as hexagons, as best suits the optimum utilization of the substrate (100).

It is important to note that while the previous example considers dielectric materials as the protective film, that the invention may be practiced with a wide range of protective films including semi-conductive and conductive protective films. Furthermore, the protective layer can consist of multiple materials. It is also important to note that some portion of the protective film may be an integral part of the final device structure (e.g., a passivation dielectric, metal bonding pad, etc.). Furthermore, the present invention can also be beneficially used with bulk wafers without the necessity of having devices or device structures. One such example may be a semiconductor substrate (Silicon, III-V compounds, etc.), mounted on a carrier or not mounted, covered by a masking material defining the structures to be etched. The substrate may also contain at least one additional layer with different material properties, such as for example an insulating layer.

Figure 3:
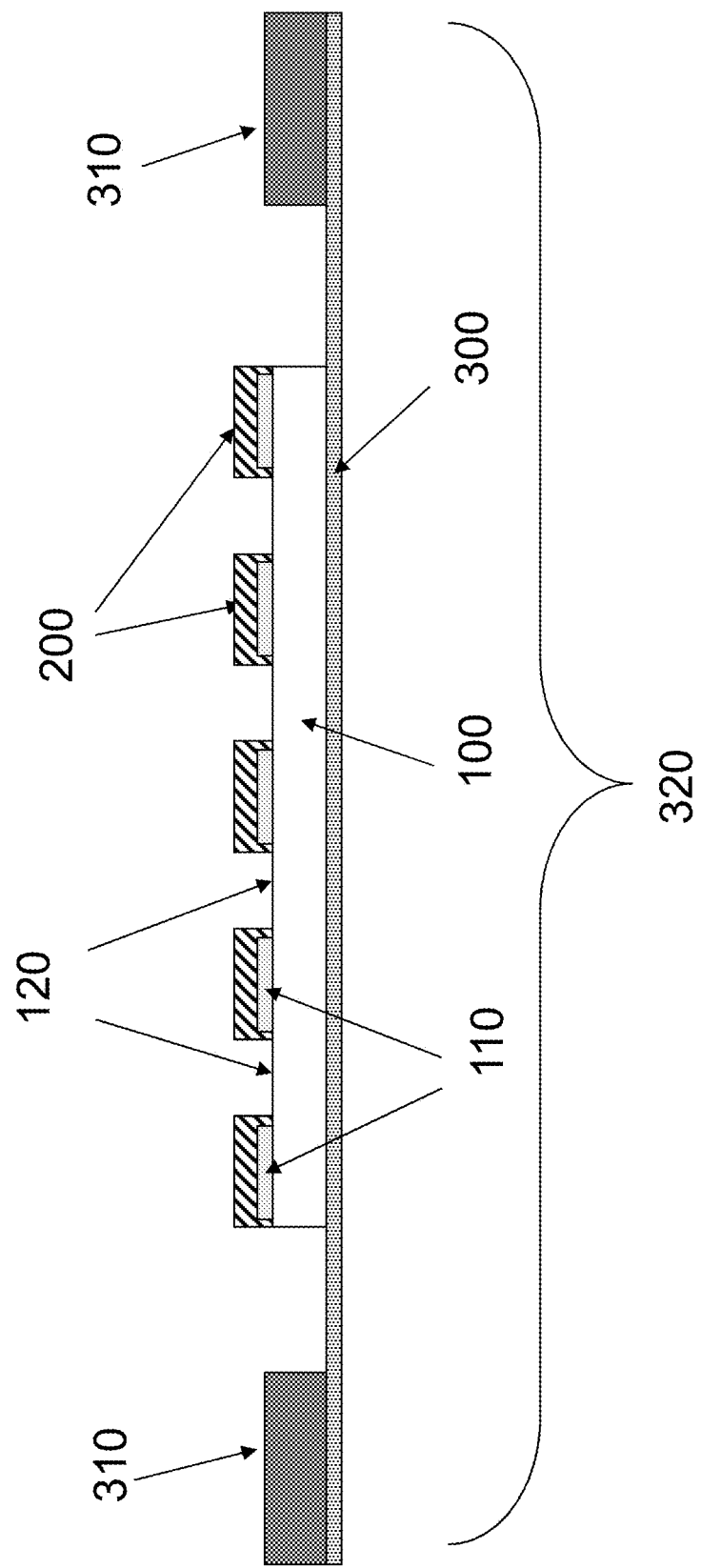
FIG. 3 is a cross-sectional view of a semiconductor substrate mounted to tape and a frame.

The substrate (100) may be thinned, typically by a grinding process, which reduces the substrate thickness to a few hundred microns to as thin as approximately 30 microns or less. As is shown in FIG. 3, the thinned substrate (100) is then adhered to a tape (300) which in turn is mounted in a rigid frame (310) to form a work piece (320). The frame is typically metal or plastic, though other frame materials are possible. The tape (300) is typically made from a carbon-containing polymer material, and may additionally have a thin conductive layer applied to its surface. The tape (300) provides support for the thinned substrate (100) which is otherwise too fragile to handle without breakage. It should be noted that the sequence of patterning, thinning and then mounting is not critical and the steps may be adjusted to best fit the particular devices and substrate and the processing equipment used. It is important to note that while the previous example considers a work piece (320) that is comprised of mounting a substrate (100) on an adhesive tape (300) which in turn is attached to a frame (310), that the invention is not limited by the configuration of the wafer and carrier. The wafer carrier can be comprised a variety of materials. The carrier supports the substrate during the plasma dicing process. Furthermore, the wafer need not be attached to the carrier using an adhesive—any method that holds the wafer to the carrier and allows a means thermal communication of the substrate to the cathode is sufficient (e.g., an electrostatically clamped carrier, a carrier with a mechanical clamping mechanism, etc.).

Figure 4:
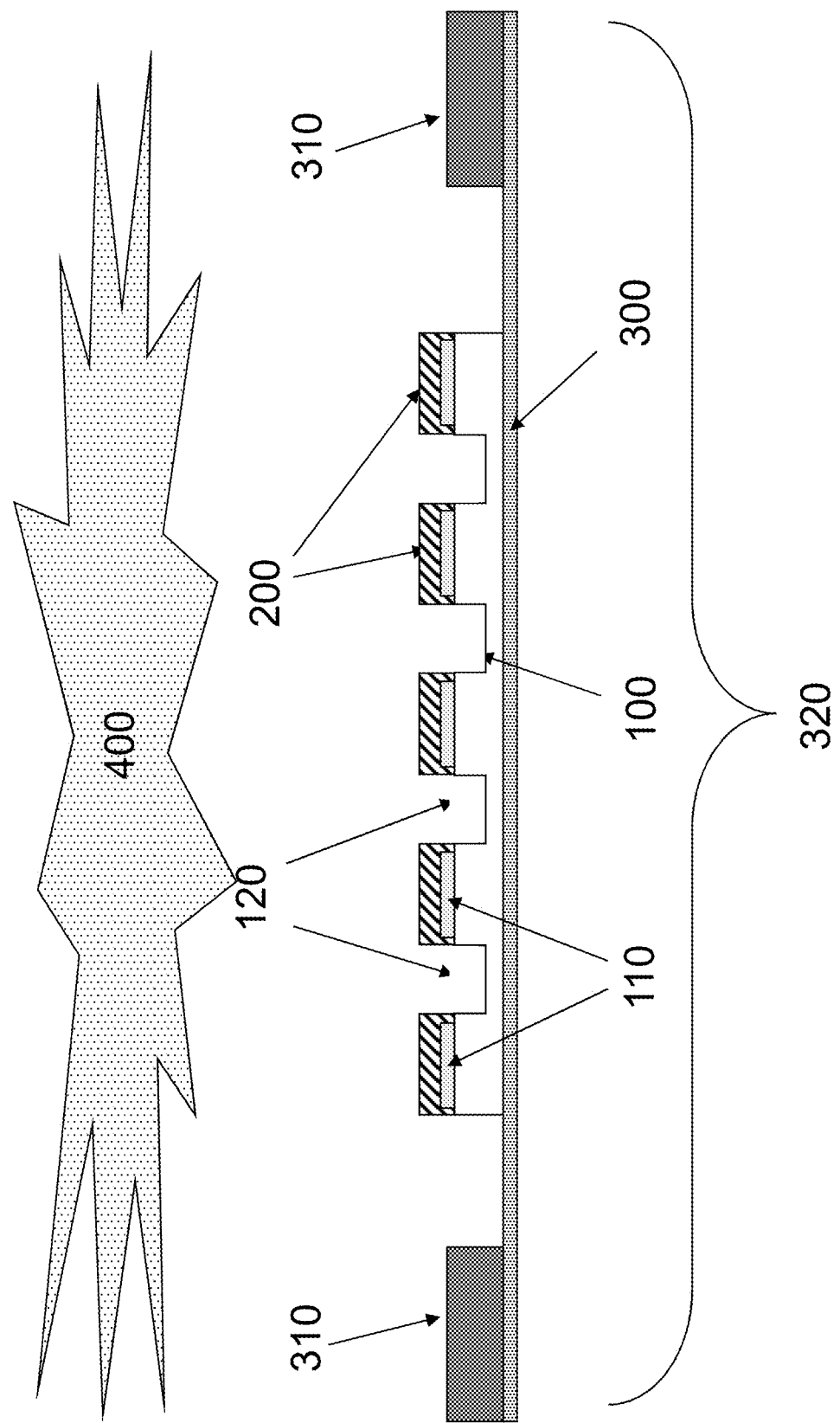
FIG. 4 is a cross-sectional view of a semiconductor substrate mounted to tape and a frame being etched by a plasma process.
Figure 5:
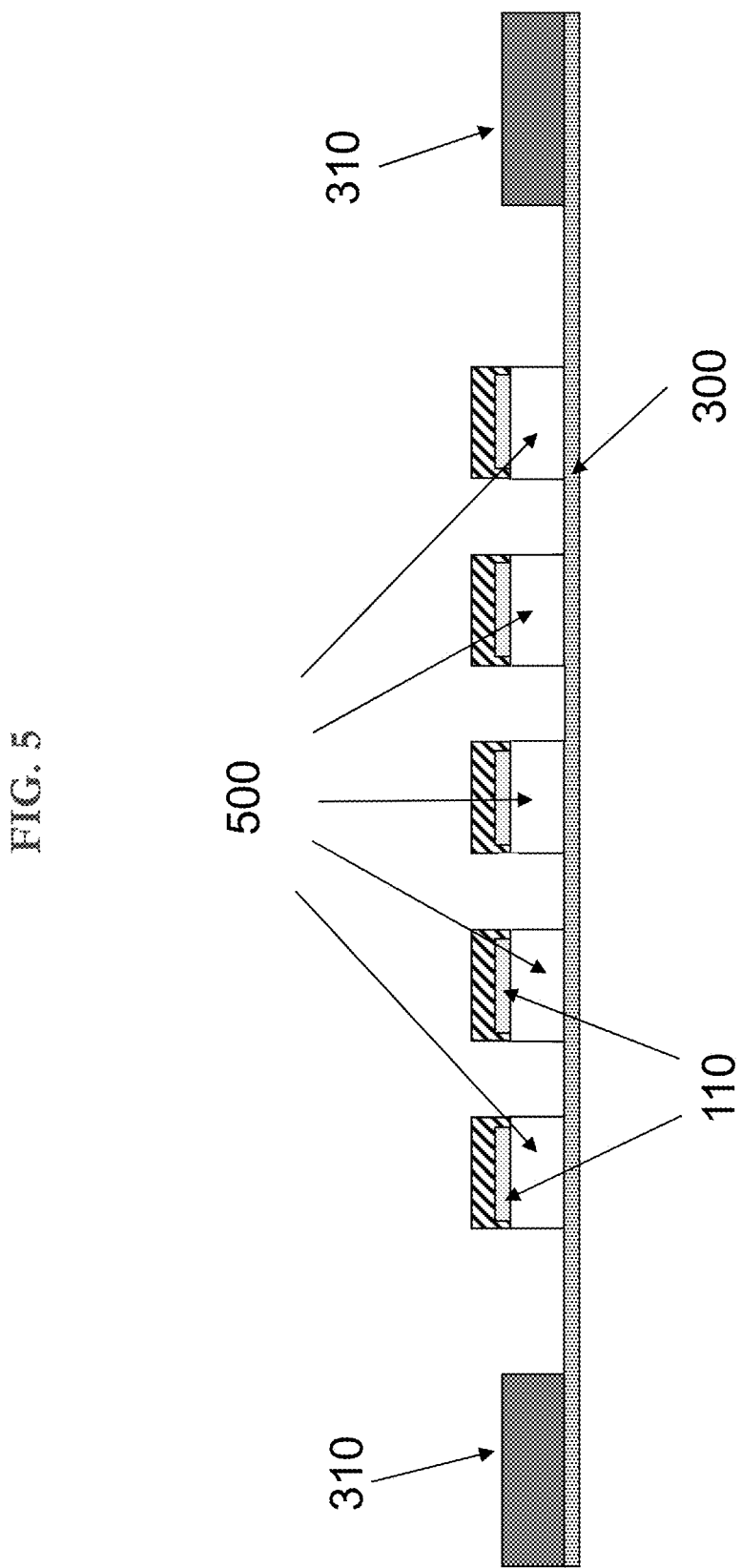
FIG. 5 is a cross-sectional view of separated semiconductor devices mounted to tape and a frame.
Figure 6:
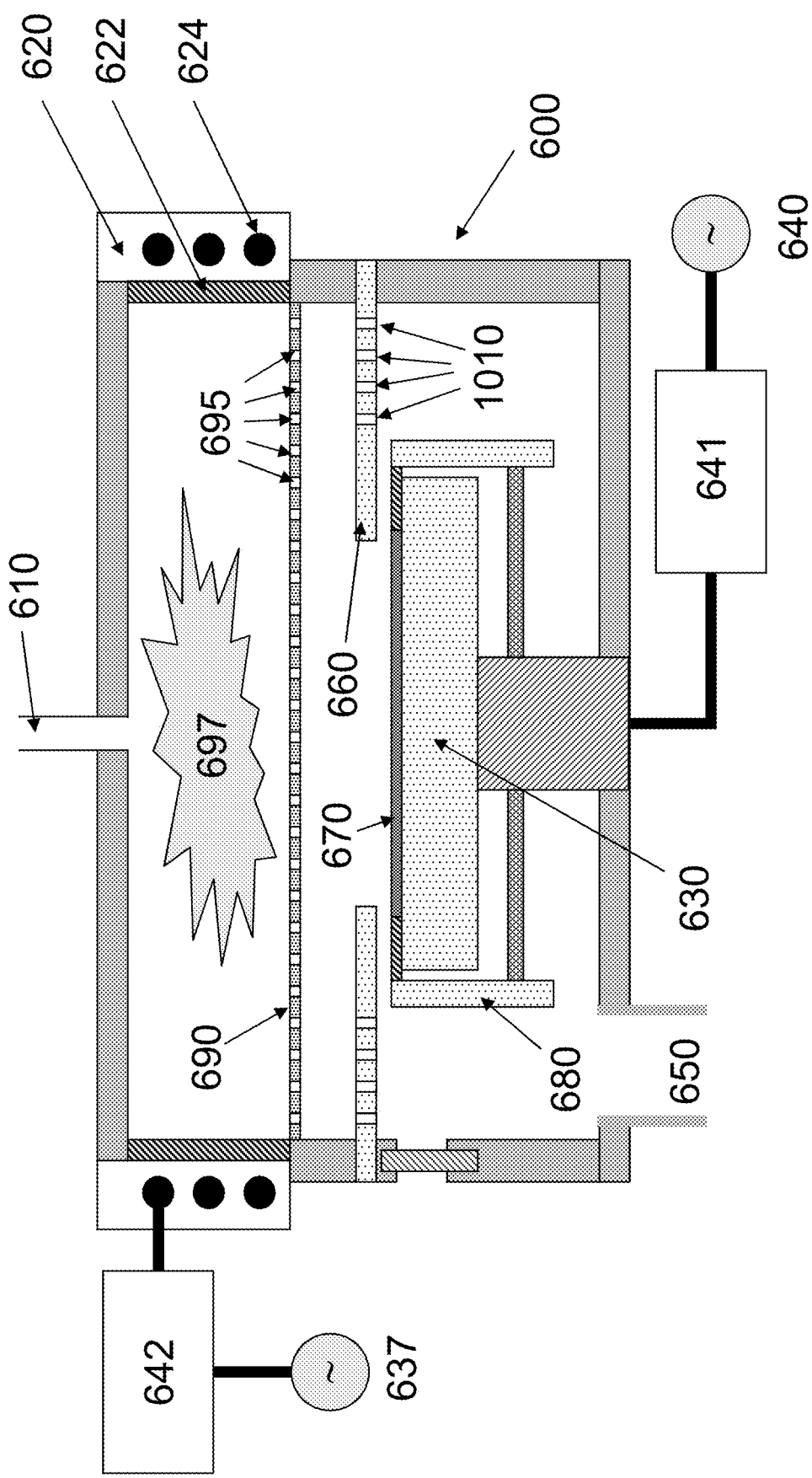
FIG. 6 is a cross-sectional view of a vacuum processing chamber.

After mounting the substrate (100) with the tape (300) in the dicing frame (310), the work piece (320) is transferred into a vacuum processing chamber. Ideally, the transfer module is also under vacuum which allows the process chamber to remain at vacuum during transfer, reducing processing time and preventing exposure of the process chamber to atmosphere and possible contamination. As shown in FIG. 6, the vacuum processing chamber (600) is equipped with a gas inlet (610), a high density plasma source (620) to generate a high density plasma, such as an Inductively Coupled Plasma (ICP), a work piece support (630) to support the work piece (320), an RF power source (640) to couple RF power to the work piece (320) through the work piece support (630) and a vacuum pump (650) for pumping gas from the processing chamber (600). During processing, the unprotected areas (120) of substrate (100) are etched away using a reactive plasma etch process (400) as shown in FIG. 4. This leaves the devices (110) separated into individual die (500) as shown in FIG. 5. In another embodiment of the invention, the unprotected areas (120) of the substrate (100) are partially etched away using a reactive plasma etch process (400). In this case, a downstream operation, such as a mechanical breaking operation, can be used to complete the die separation. These downstream methods are well known in the art.

While the previous example describes the invention using a vacuum chamber in conjunction with a high density plasma (e.g., ECRs, ICP, helicon, and magnetically enhanced plasma sources), it is also possible to etch the unprotected areas of the substrate using a wide range of plasma processes. For example, one skilled in the art can imagine variations of the invention using a low density plasma source in a vacuum chamber or even the use of plasmas at or near atmospheric pressures.

Figure 7:
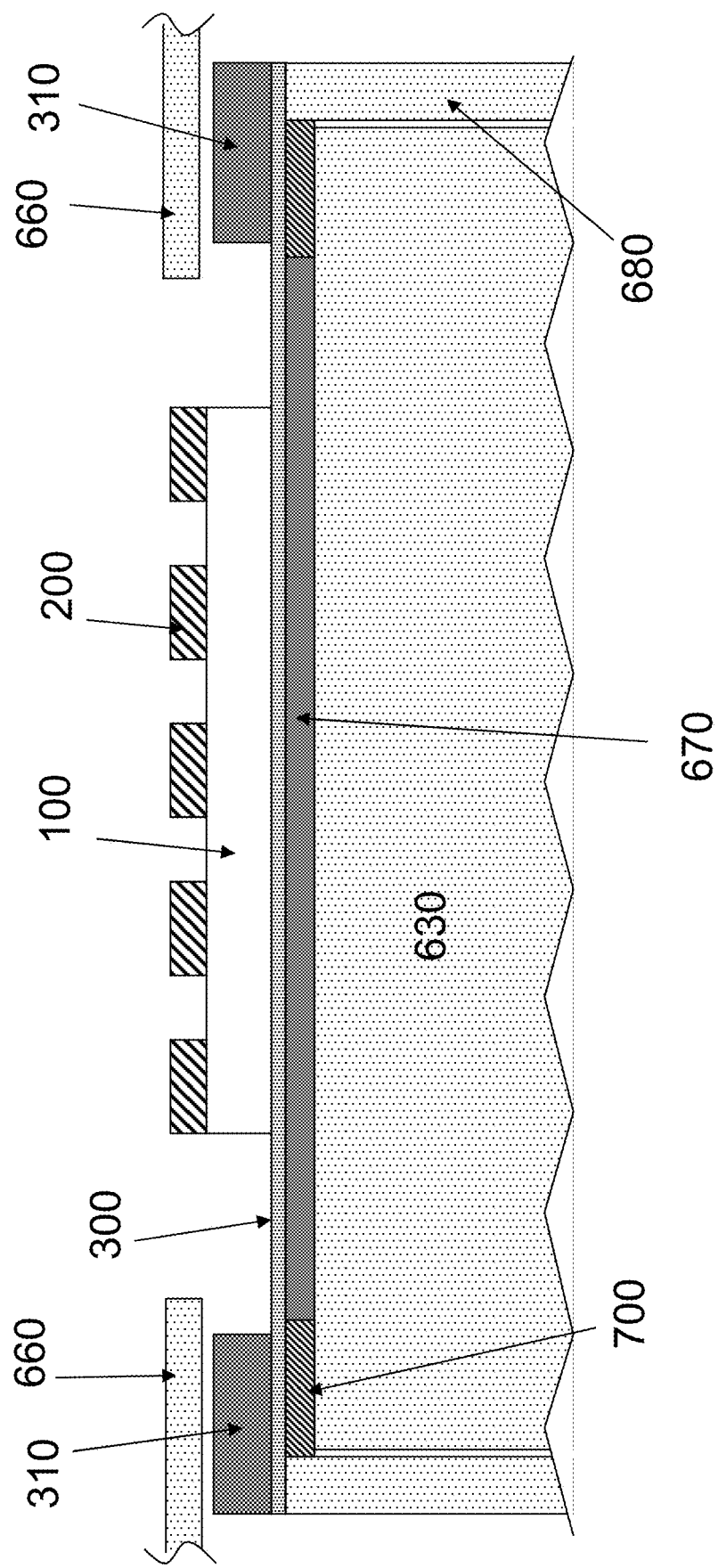
FIG. 7 is a cross-sectional of a wafer/frame in process position.
Figure 8:
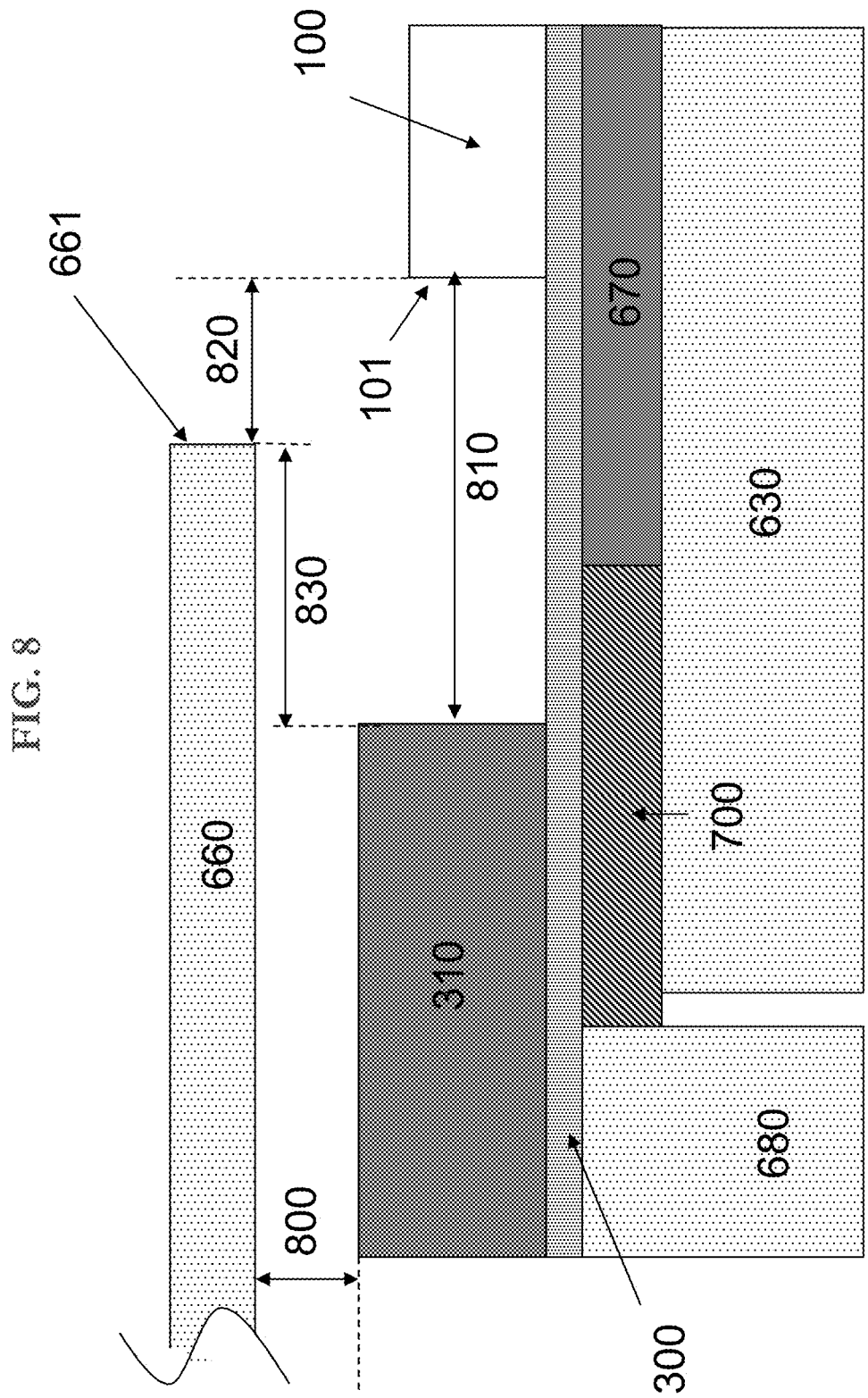
FIG. 8 is an enlarged cross-sectional view of a frame and a cover ring in a vacuum processing chamber.

When the work piece (substrate/tape/frame assembly) (320) is in the position for plasma processing, the frame (310) can be protected from exposure to the plasma (400). Exposure to the plasma (400) may cause heating of the frame (310) which in turn may cause local heating of the mounting tape (300). At temperatures above approximately 100 degrees Celsius, the physical properties of the tape (300) and its adhesive capability may deteriorate and it will no longer adhere to the frame (310). Additionally, exposure of the frame (310) to the reactive plasma gas may cause degradation of the frame (310). Since the frame (310) is typically re-used after wafer dicing, this may limit the useful lifetime of a frame (310). Exposure of the frame (310) to the plasma (400) may also adversely affect the etch process: for example the frame material may react with the process gas, effectively reducing its concentration in the plasma which may reduce the etch rate of the substrate material, thus increasing process time. To protect the frame (310), a protective cover ring (660), as shown in FIGS. 6, 7 and 8, is positioned above the frame (310). In one embodiment, the cover ring (660) does not touch the frame (310) since contact with the frame (310) (which would occur during transfer into the process chamber (600)) may generate undesirable particles.

In FIG. 8, dimension (800) represents the distance between the cover ring (660) and the frame (310). This dimension can range from greater than approximately 0.1 mm to less than approximately 20 mm with an optimal value of 4 mm. If the distance (800) is too large, plasma will contact the frame (310) and the benefits of the cover ring (660) will be lost.

Figure 9:
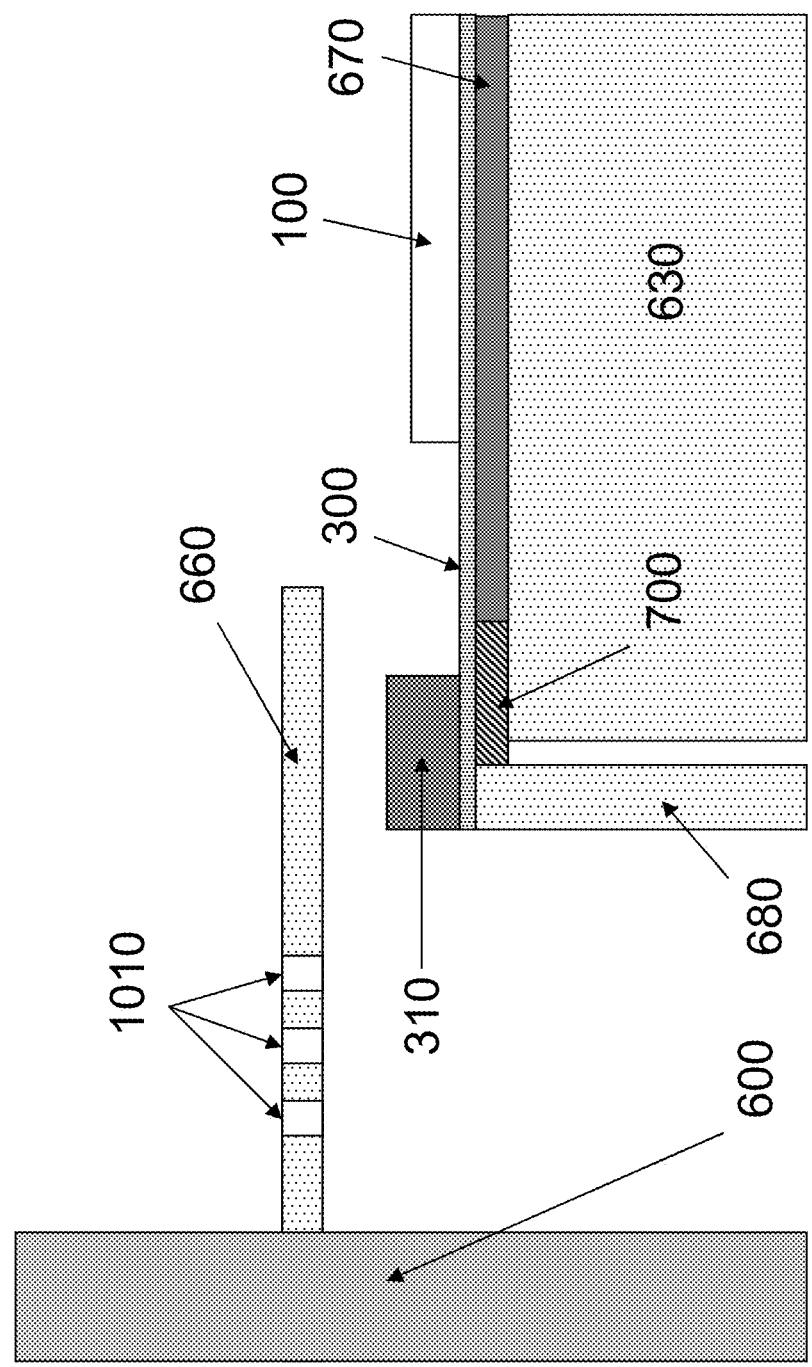
FIG. 9 is a cross-sectional view of a section of the inside the chamber with the cover ring mounted to a chamber wall.
Figure 10:
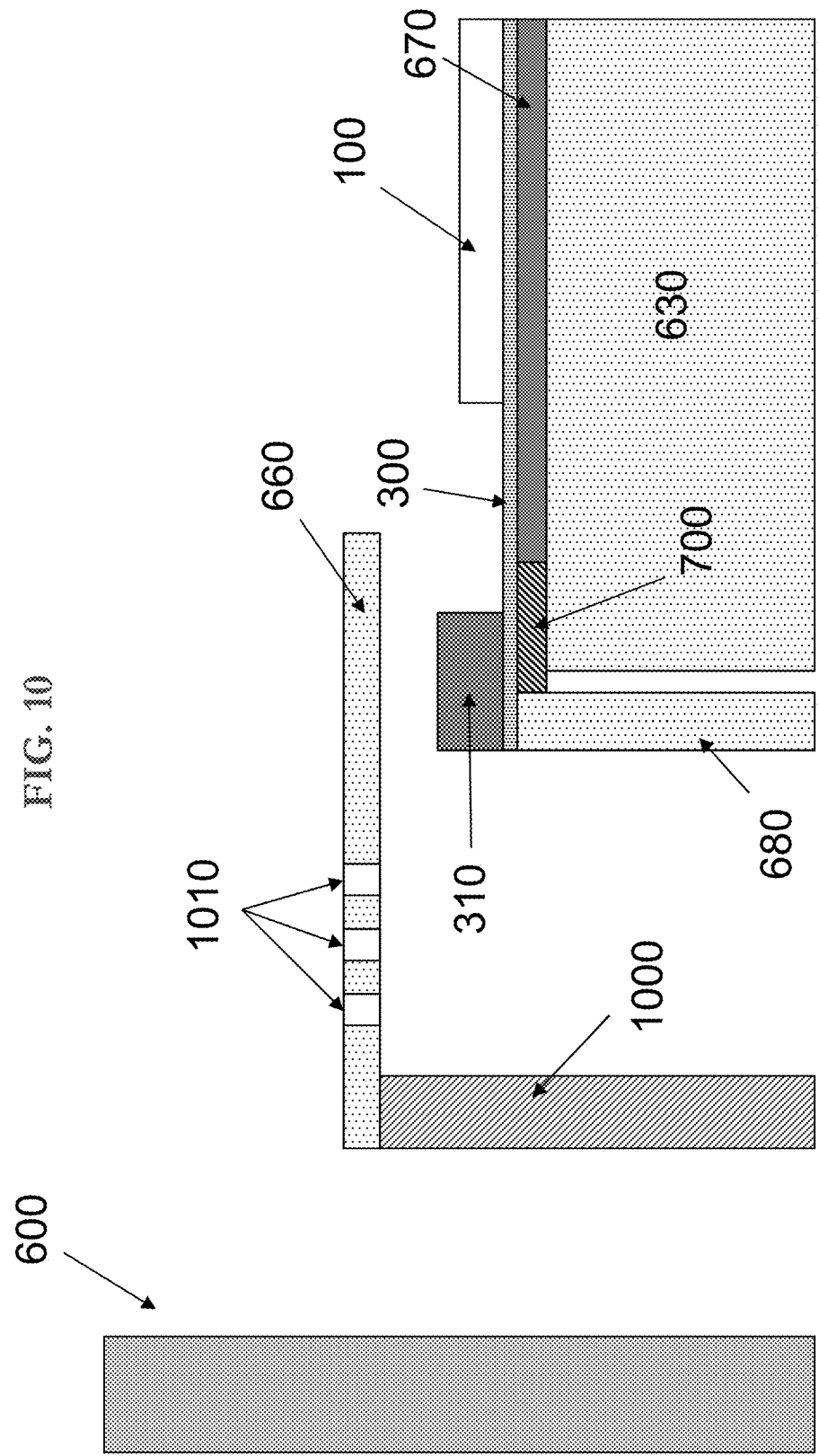
FIG. 10 is a cross-sectional view of a section of the inside the chamber with the cover ring mounted to an internal heat sink.

In one embodiment the cover ring (660) is temperature controlled. Without cooling, the cover ring (660) temperature may increase due to exposure to the plasma and in turn heat the tape (300) and the frame (310) via thermal radiation, causing degradation as noted above. For the case where the cover ring (660) is cooled, cooling of the cover ring (660) is accomplished by having it in direct contact with a cooled body, such as the wall of the process chamber (600) shown in FIG. 9 or a heat sink (1000) located within the process chamber (600) shown in FIG. 10. To ensure that heat is adequately removed from the cover ring (660) to the heat sink (1000), the cover ring (660) should be made of a material that has good thermal conductivity. Such materials include many metals, for example Aluminum, but other thermally conductive materials, such as Aluminum Nitride and other ceramics can be used. The choice of the cover ring material is chosen to be compatible with the plasma process gases used. While Aluminum is satisfactory for Fluorine based processes, an alternate material, such as Aluminum Nitride, or the addition of a protective coating, such as Aluminum Oxide may be necessary when Chlorine based processes are used. Operation temperature of the cover ring (660) during plasma processing ranges from about 25 degrees Celsius to about 350 degrees Celsius. Preferably the temperature of the cover ring (660) is held in the range of 50 degrees Celsius to 90 degrees Celsius which minimizes thermal radiation to the tape (300) and the frame (310) and ensures that the tape (300) maintains its mechanical integrity. Alternatively, the cover ring (660) may be temperature controlled by bringing the cover ring (660) into contact with a temperature controlled fluid. This fluid can be a liquid or gas. In the case where the cover ring (660) temperature is controlled by a fluid, the cover ring (660) may contain a number of fluid channels to facilitate heat transfer. These fluid channels can be internal to the cover ring (660), externally attached, or some combination of the two.

Figure 11:
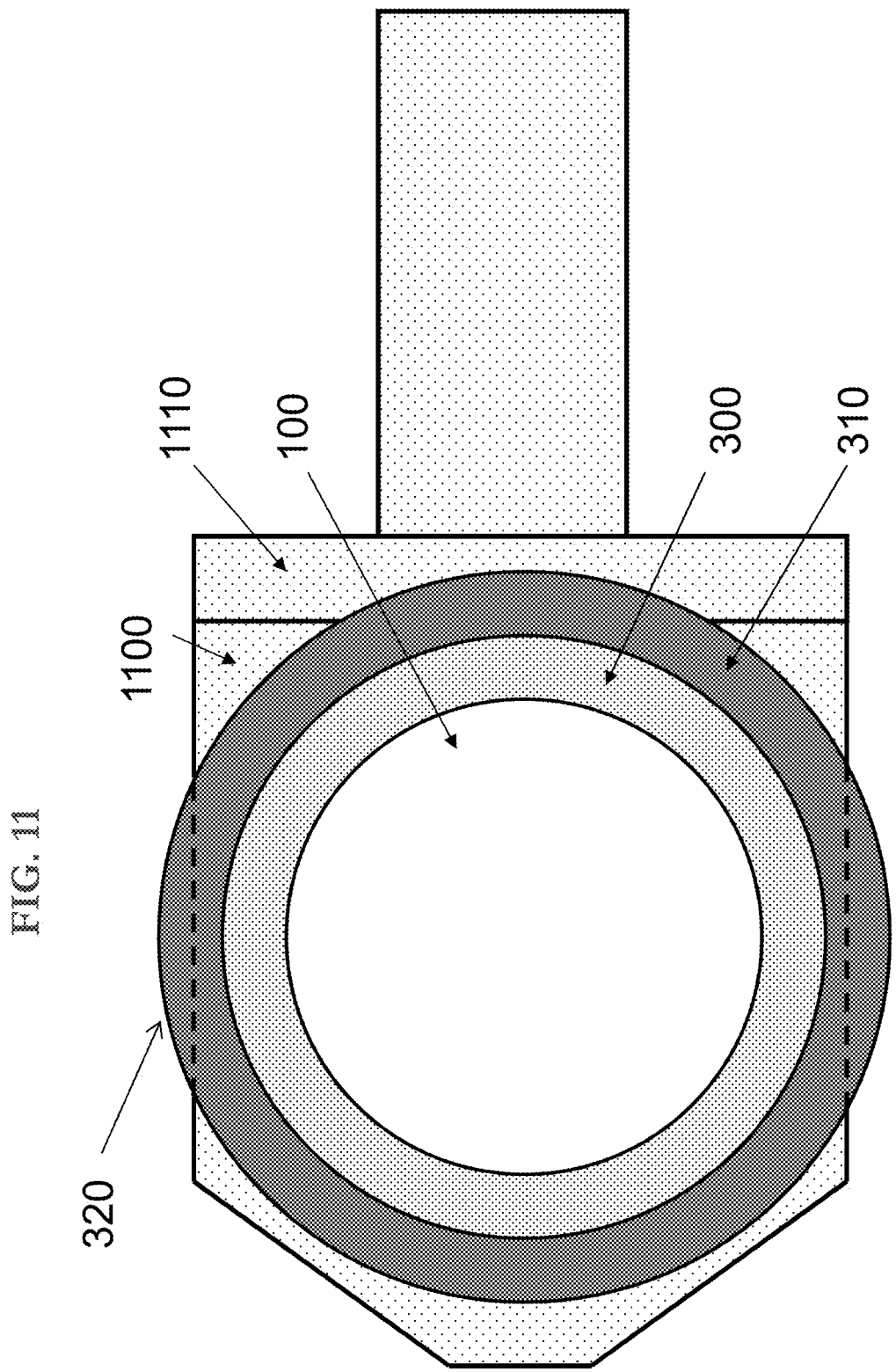
FIG. 11 is a top down view of a semiconductor substrate mounted to tape and a frame supported by a transfer arm.
Figure 12:
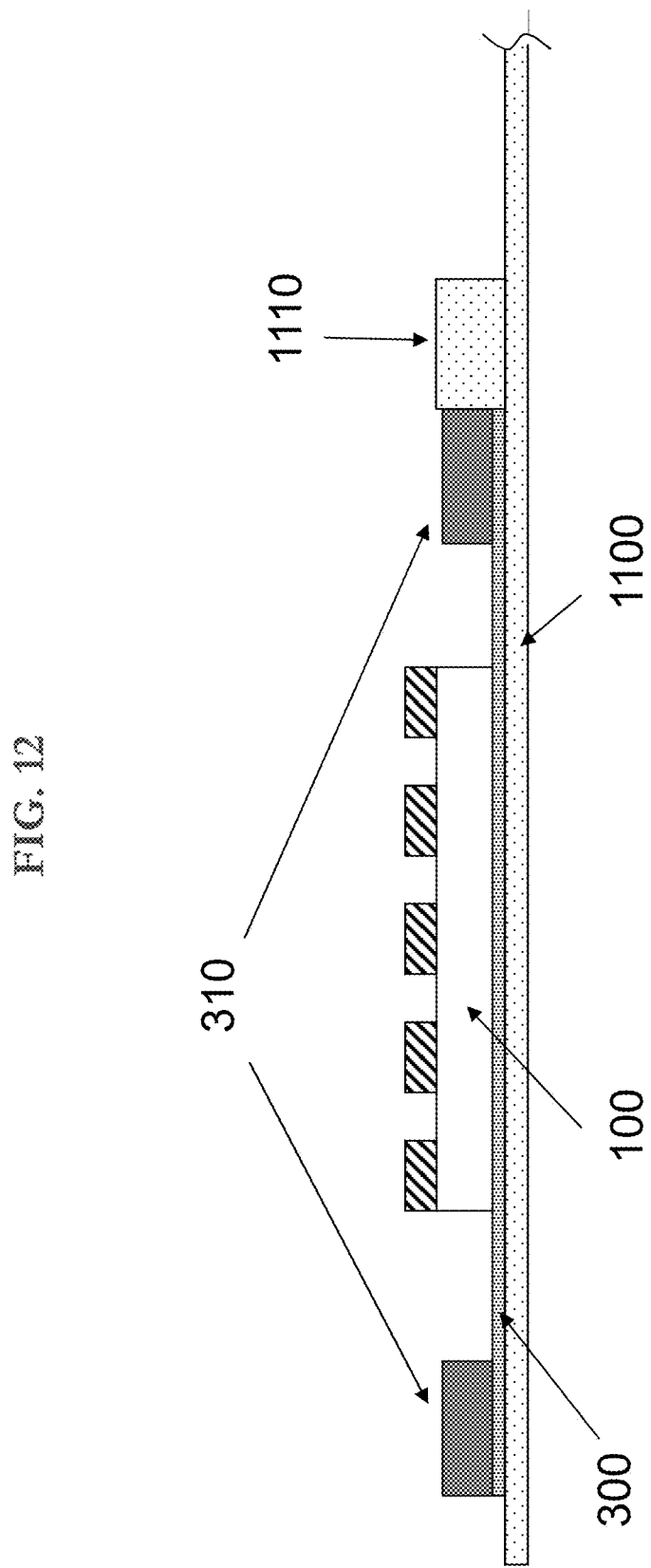
FIG. 12 is a cross-sectional view of a semiconductor substrate mounted to tape and a frame supported by a transfer arm.

The work piece (substrate/tape/frame assembly) (320) is transferred both into and out of the process chamber (600) by a transfer arm (1100) that supports the frame (310) and substrate (100) so that they are maintained nearly coplanar as shown in FIGS. 11 and 12. The transfer arm (1100) may support both the tape (300) and the frame (310) or the frame (310) alone, but it is important that the assembly (320) not be supported beneath the substrate (100) area alone because of the fragile nature of thinned substrates (100). The transfer arm (1100) has an alignment fixture (1110) attached to it that aligns the frame (310) in a repeatable position before being transferred into the process chamber (600). The frame (310) can also be aligned by other techniques well-known in semiconductor processing (e.g., optical alignment). The alignment can also be performed on the substrate (100) by such well-known techniques. It is important that the work piece (substrate/tape/frame assembly) (320) be aligned before placement within the process chamber (600) to avoid miss-processing as explained below.

In FIG. 8, the substrate-to-frame dimension (810) represents the distance between the outer diameter of the substrate (100) and the inner diameter of the frame (310). This may be 20 mm to 30 mm (e.g., Disco Corporation dicing frame has an inner diameter of about 250 mm for 200 mm substrates, so that the substrate-to-frame dimension (810) is nominally 25 mm). During mounting of the wafer (100) on the tape (300) within the frame (310), the deviation of wafer (100) placement may be as much as 2 mm so that the cover ring to substrate distance (820), which is the distance between the substrate (100) outer diameter and the inner diameter of the cover ring (660) can also vary from assembly to assembly by up to 2 mm. If at some point the cover ring to substrate distance (820) is less than zero, the cover ring (660) will overlay the edge of the substrate (100). This area of the substrate will be shadowed and prevented from etching, which can prevent die separation and cause problems in subsequent processing steps. It is preferred that the cover ring (660) does not overlap the substrate (100). Alignment of the substrate/tape/frame assembly (320) prior to transfer is required to prevent such problems. Further, to additionally ensure that cover ring to substrate distance (820) is not less than zero, the cover ring inner diameter should be greater than the diameter of the substrate (100). It is preferred that the cover ring inner diameter be 5 mm greater than the substrate diameter (e.g., 205 mm cover ring inner diameter for 200 mm substrate). The cover ring overhang dimension (830) in FIG. 8 represents the distance from the inner diameter of the cover ring (660) to the inner diameter of the frame (310). Alignment of the frame (310) prior to transfer into the process chamber (600) ensures that the cover ring overhang dimension (830) remains essentially constant for the entire circumference around the substrate (100) and that any portion of tape (300) that is not contacted by the Electrostatic chuck (ESC) (670) is substantially shadowed from the plasma. In a preferred embodiment any tape (300) that is not in thermal contact with the ESC (670) is overlapped by the cover ring (660).

Figure 13:
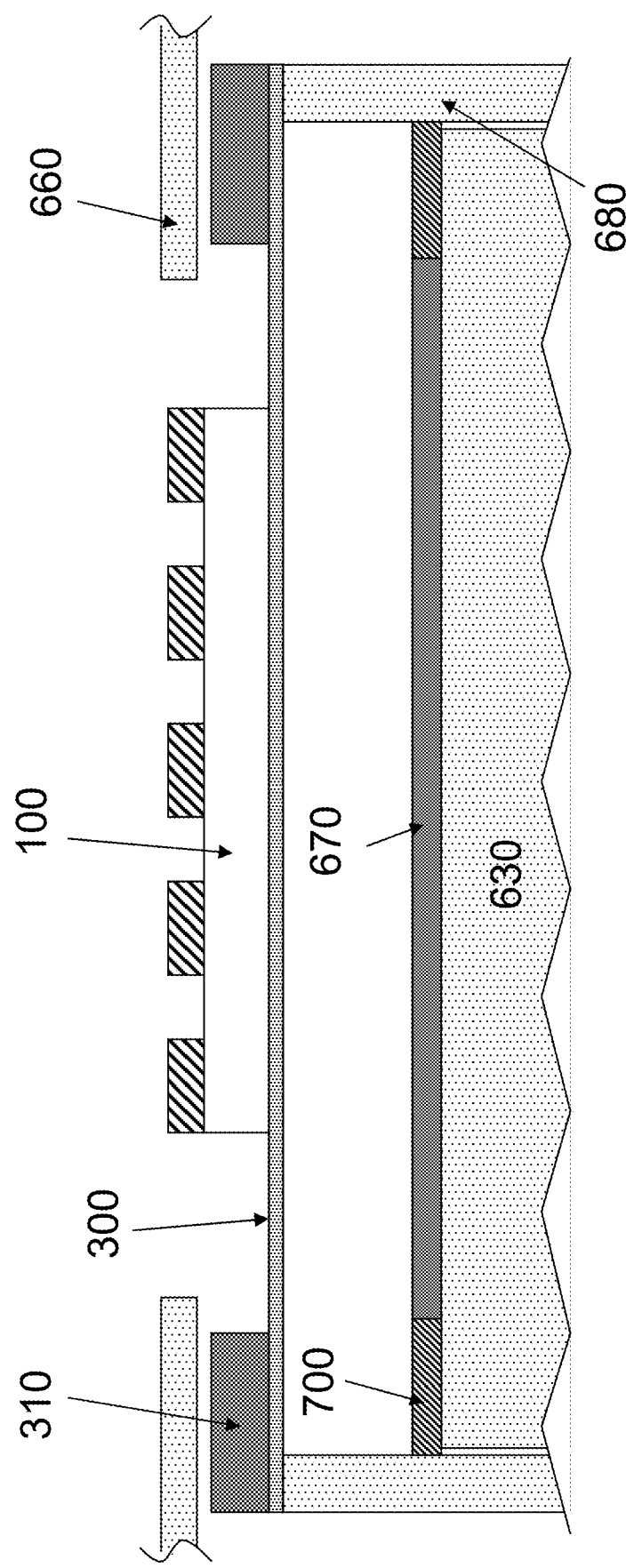
FIG. 13 is a cross-sectional view of a wafer/frame in a transfer position.

When the work piece (e.g., substrate/tape/frame assembly) (320) is transferred into the process chamber (600), it is placed onto the lifting mechanism (680) and removed from the transfer arm (1100). The reverse process occurs during transfer of the work piece (e.g., substrate/tape/frame assembly) (320) out of the process chamber (600). The lifting mechanism (680) touches the frame (310) area and provides no point contact to the substrate (100). Point contact to the substrate (100) can cause damage to the substrate (100), particularly after die separation and unloading of the work piece (320), since the flexibility of the tape (300) may cause the die to contact each other and damage to occur. FIG. 13 shows the lifting mechanism (680) lifting the frame (310) from the underside; however, the frame (310) can also be removed from the transfer arm (1100) by contact with the top surface, bottom surface, outer diameter of the frame (310) or any combination of these using a clamping device. In order to have enough clearance to place the work piece (320) on the work piece support (630) to process the substrate (100), the frame (310), the work piece support (630), and the cover ring (660) can move relative to each other. This can be accomplished by moving the cover ring (660), the work piece support (630), or the lifting mechanism (680) or any combination of the three.

During plasma processing, heat is transferred to all of the surfaces the plasma touches including the substrate (100), tape (300), and frame (310). The cover ring (660) will minimize the heat transfer to areas of the tape (300) and the frame (310), but the substrate (100) must be exposed to the plasma (400) for processing.

Figure 14:
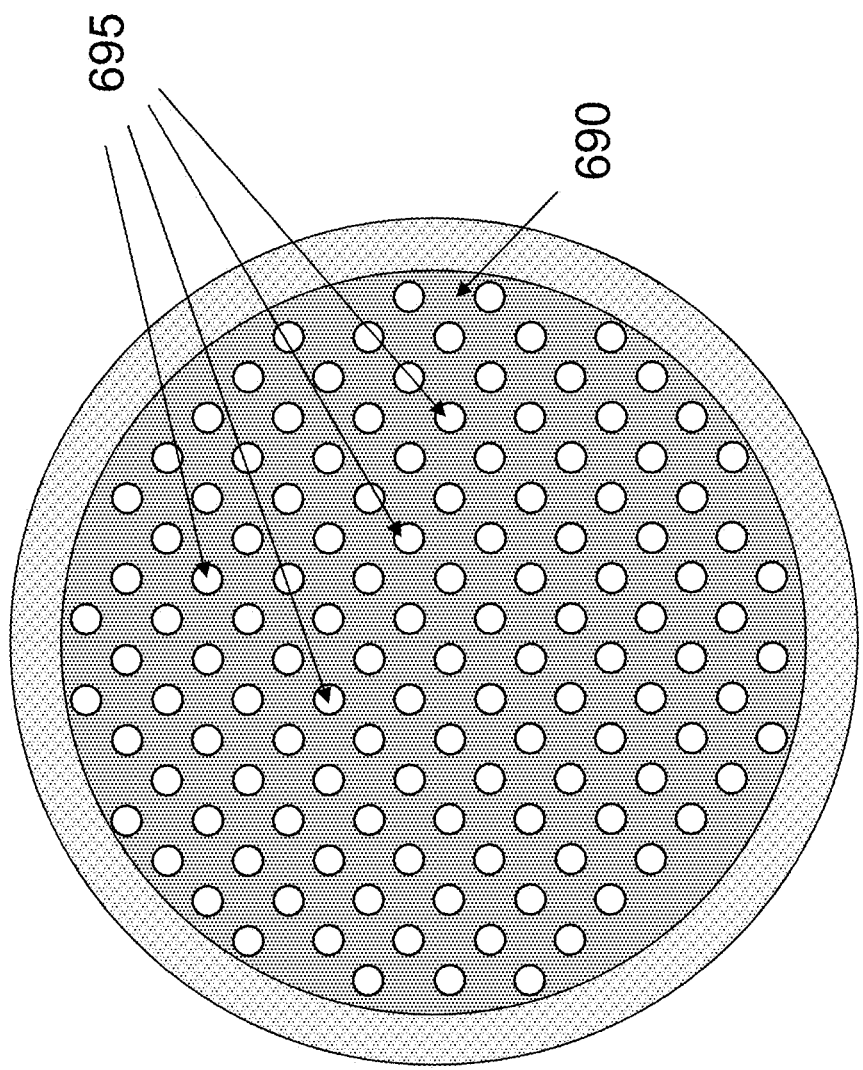
FIG. 14 is a top view of a screen.
Figure 23:
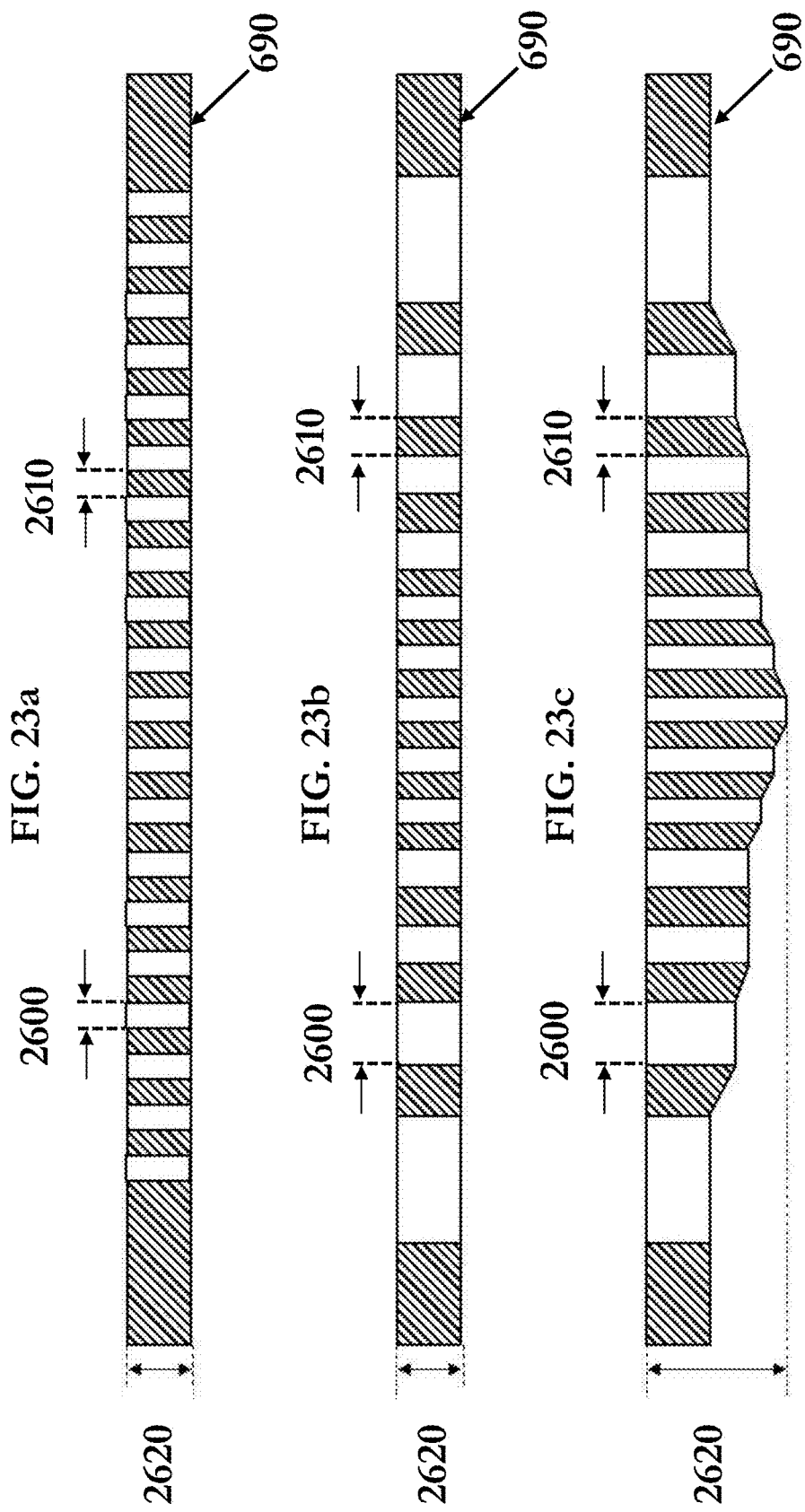
FIGS. 23a-23c are cross sectional views of variations of mechanical partitions according to the present invention.

The perforations (695) in the mechanical partition (690) can be arranged in a number of ways. FIG. 14 shows a top view of a mechanical partition (690) with a pattern of perforations (695) that are uniformly distributed in a rectilinear pattern. While FIG. 14 shows a rectilinear pattern of perforations (695), alternate configurations including hexagonal, honeycomb or circular perforation patterns may be used. The dimensions of the perforations (2600) may vary across the mechanical partition (690) (e.g., FIGS. 23b and 23c).

In an alternate embodiment, the perforation pattern in the mechanical partition (690) may designed such that the spacing between perforations (2610) is variable (e.g., FIGS. 23b and 23c). In yet another embodiment, the size and/or shape of the perforations may vary across the mechanical partition (690). The mechanical partition (690) can have a perforation pattern such that both the perforation size (2600) and spacing (2610) vary across the partition.

Figure 15:
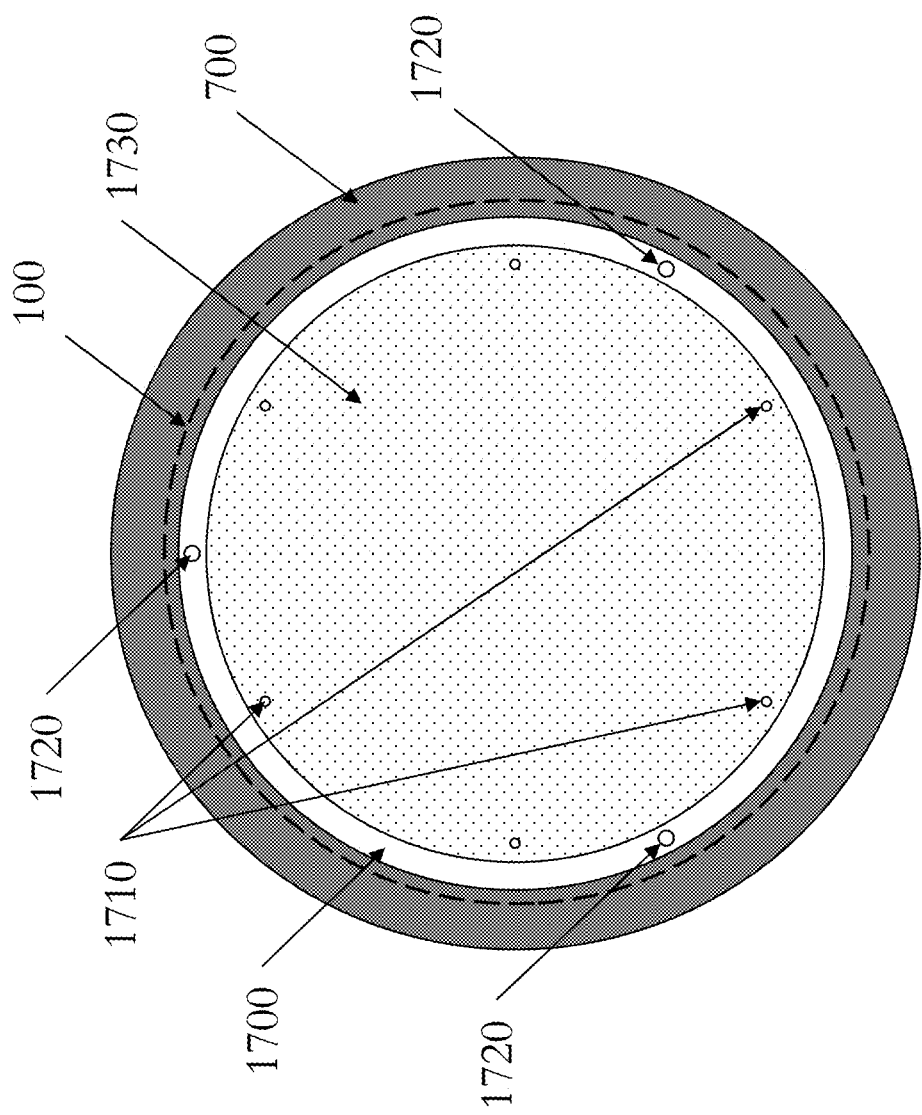
FIG. 15 is a top view of an electrostatic chuck according to the prior art.
Figure 16:
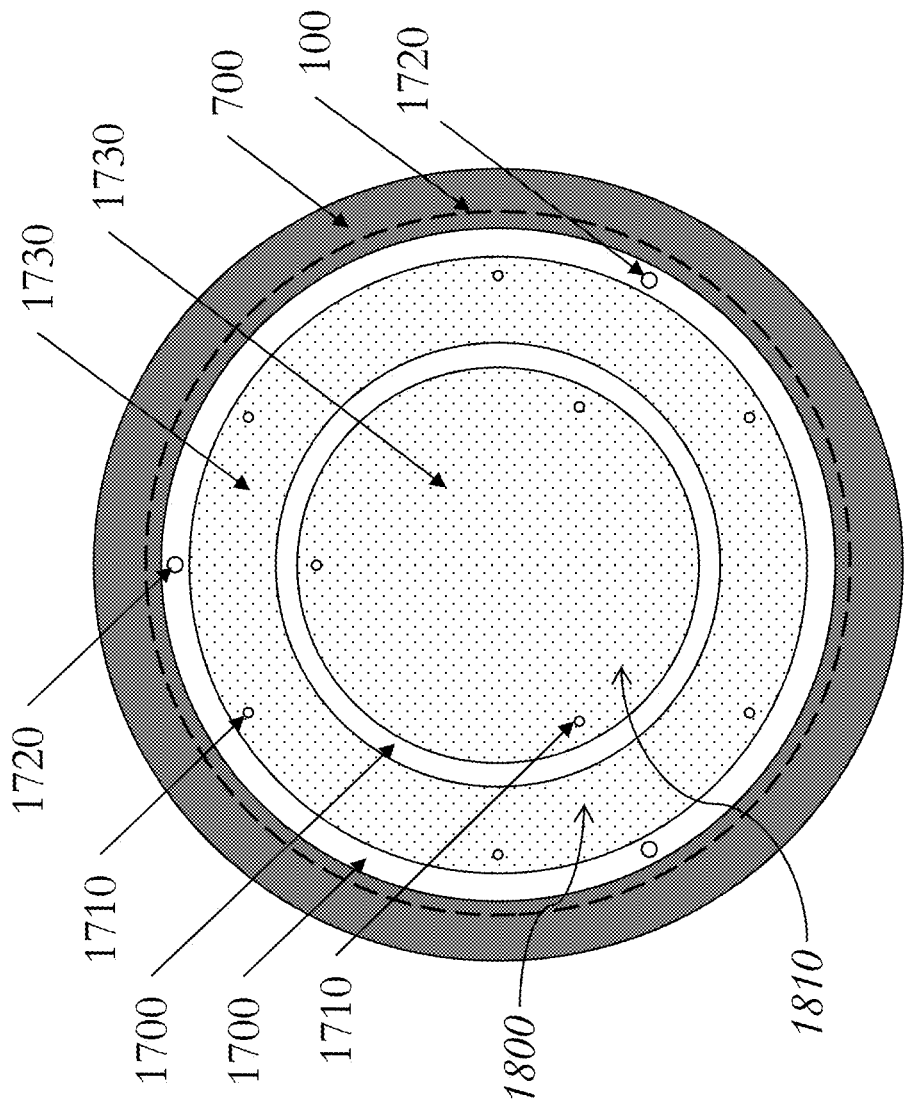
FIG. 16 is a top view of a multi-zone electrostatic chuck according to the prior art.
Figure 17:
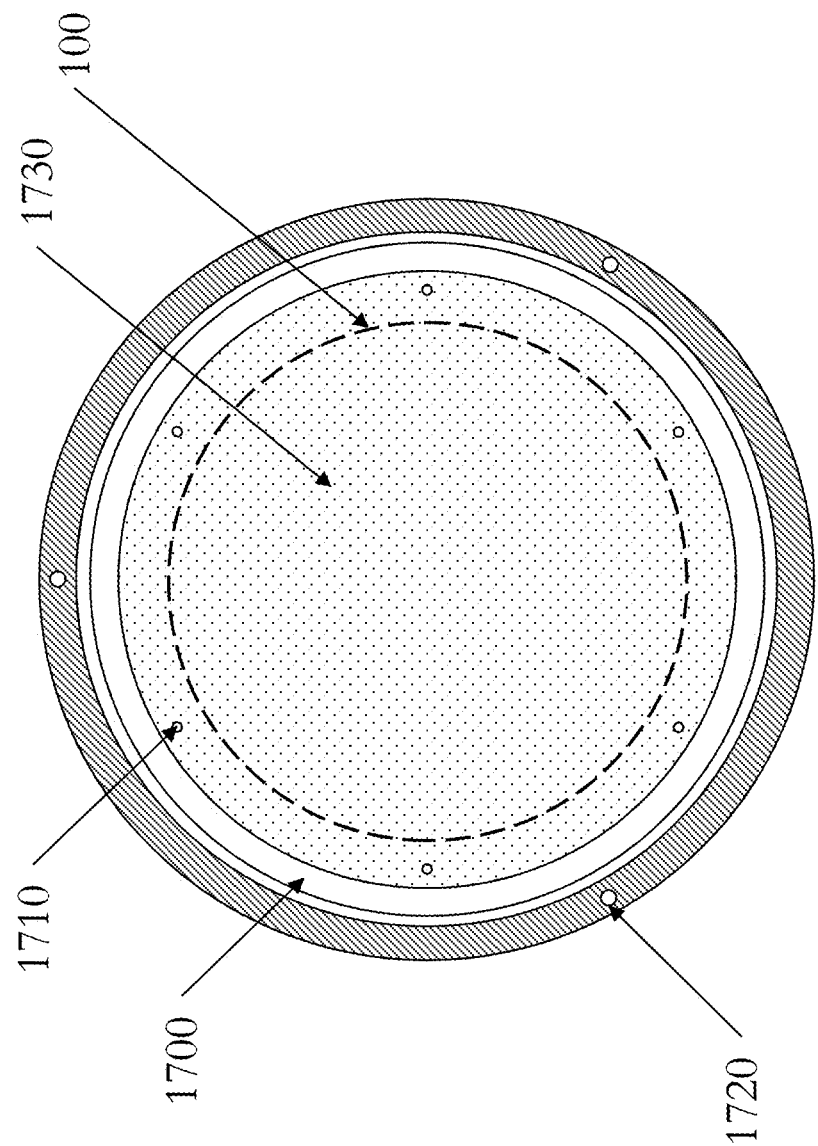
FIG. 17 is a top view of an electrostatic chuck according to one embodiment of the present invention.
Figure 18:
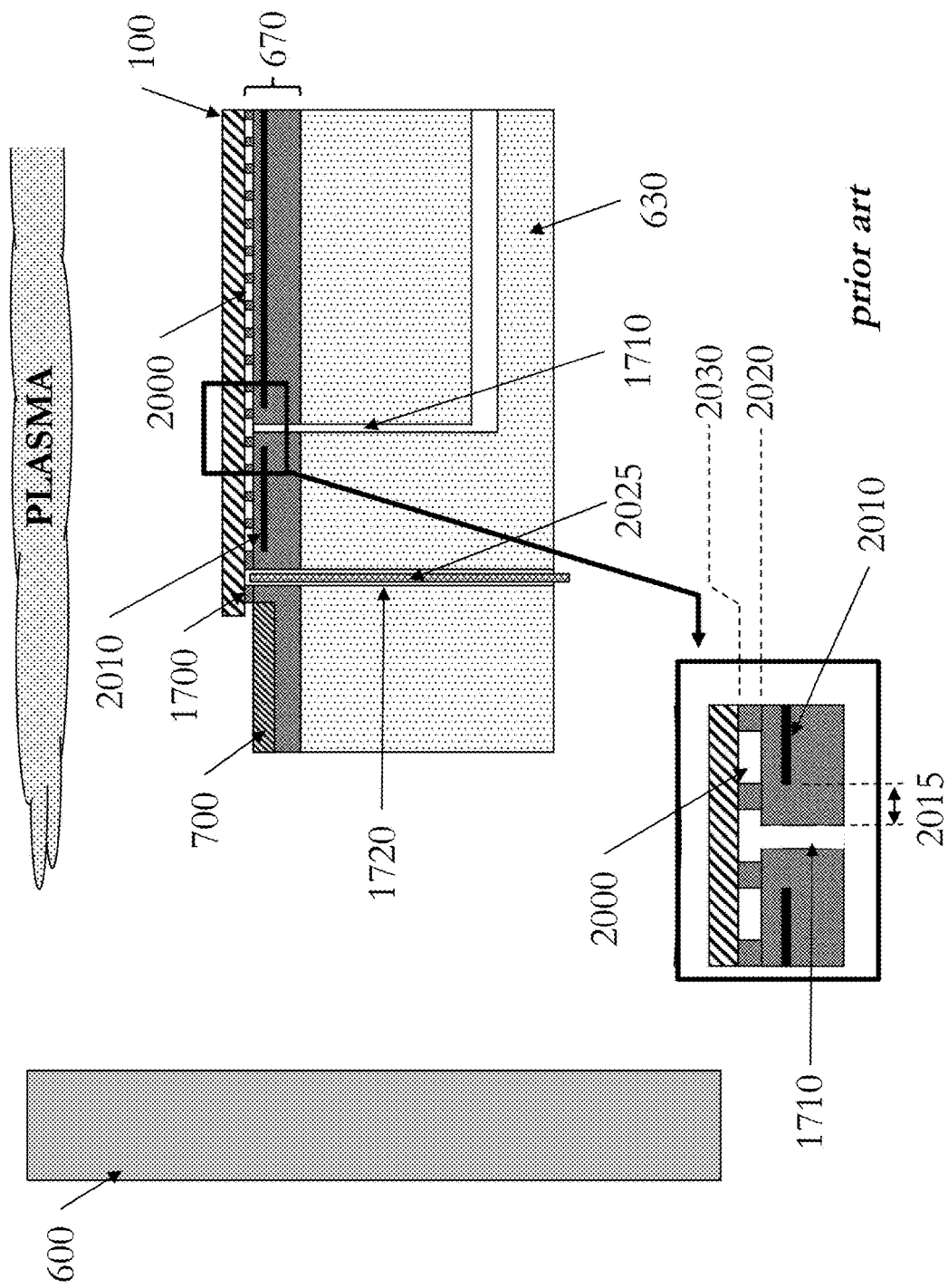
FIG. 18 is a cross-sectional view of a substrate on an electrostatic chuck according to the prior art.

FIG. 15 shows a top view of an electrostatic chuck as is known in the art. An ESC (670) will commonly have a sealing region or regions (1700) to confine the pressurized fluid between the ESC and the substrate (100) being clamped. The sealing regions (1700) are commonly employed near the perimeter of the ESC and around any features that would otherwise cause the pressurized fluid to leak and degrade the heat transfer. Some ESCs make use of multiple concentric seal bands (1700) as shown in FIG. 16 to generate discrete volumes or zones (1800, 1810) that allow independent control of the fluid pressure within the respective zone. These ESCs are commonly described as multi pressure zone ESCs. It is also possible that the pressure zones (1800, 1810) are not discrete and some of the pressurized fluid leaks between zones. Wide sealing regions (1700) are typically not preferred. Typically, the thermal gradients across the work piece area which overlaps said wide sealing region may negatively impact some characteristic of the etch. On the contrary, if a sealing region is not wide enough, the pressurized fluid may leak and heat transfer may degrade. As shown in FIG. 15, in the prior art the sealing regions or bands (1700) described above do not extend past the substrate (100) since doing so would expose the sealing surface of the seal band (1700) to potentially corrosive plasma gases that may decrease the lifetime of the ESC. FIG. 18 shows the cross sectional view of a rigid substrate (100) on an electrostatic chuck as is known in the art. Note that the seal band (1700) is overlapped by the substrate (100). Furthermore, it is typical in the art to have the substrate (100) extend beyond the edge of the sealing surface (1700) in order to accommodate for any placement error during placement of the wafer on the ESC (670). It is also important to note that in the prior art that the lift pin holes (1720) and lift pins (2025) used to lift the substrate off the ESC are also located under the substrate (100)—inside or within the outermost seal band (1700). Finally, ESCs known in the art have the clamping electrode(s) (2010) confined to the areas underneath the substrate (100). Therefore the clamping electrode (2010) is inside of the area defined by the outer seal band (1700)—both of which are inside the wafer perimeter.

Figure 19:
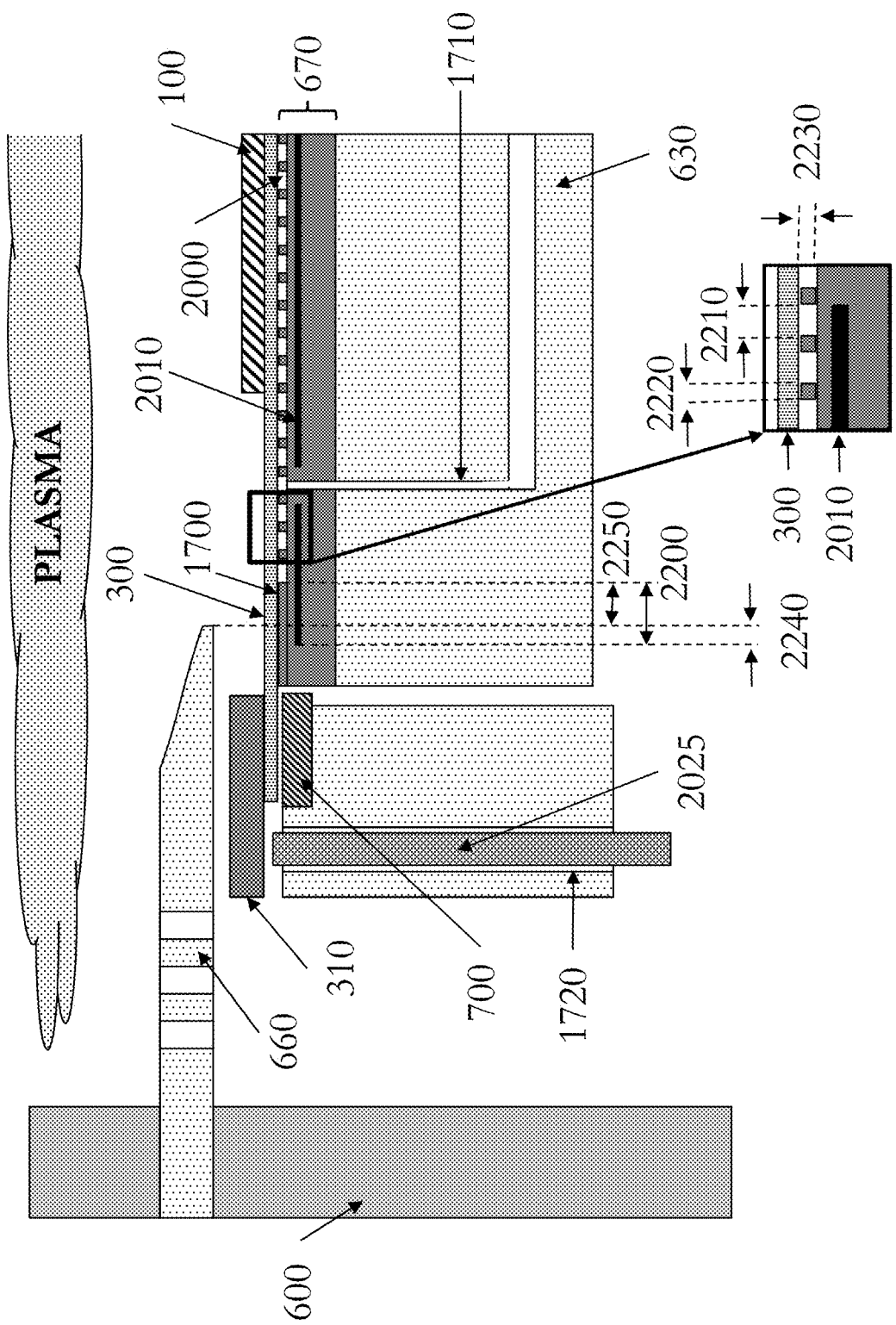
FIG. 19 is a cross-sectional view of a work piece on an electrostatic chuck according to one embodiment of the present invention.

FIG. 19 shows a cross sectional view for one embodiment of the current invention. When clamping a flexible work piece (e.g., a work piece (320) containing tape (300), etc.), it is preferable to have at least one clamping electrode (2010) overlap the sealing region (1700) as depicted in FIG. 19. This is particularly important when a flexible region of the work piece overlaps the sealing region (1700). Overlap of the clamping electrode (2010) with the flexible work piece (300) helps minimize Helium gas leakage. Preferably this overlap (2200) is greater than 1 mm wide. The overlap (2200) can be along inside seal band perimeter, outer seal band perimeter, within the seal band, or some combination of the three.

Figure 21:
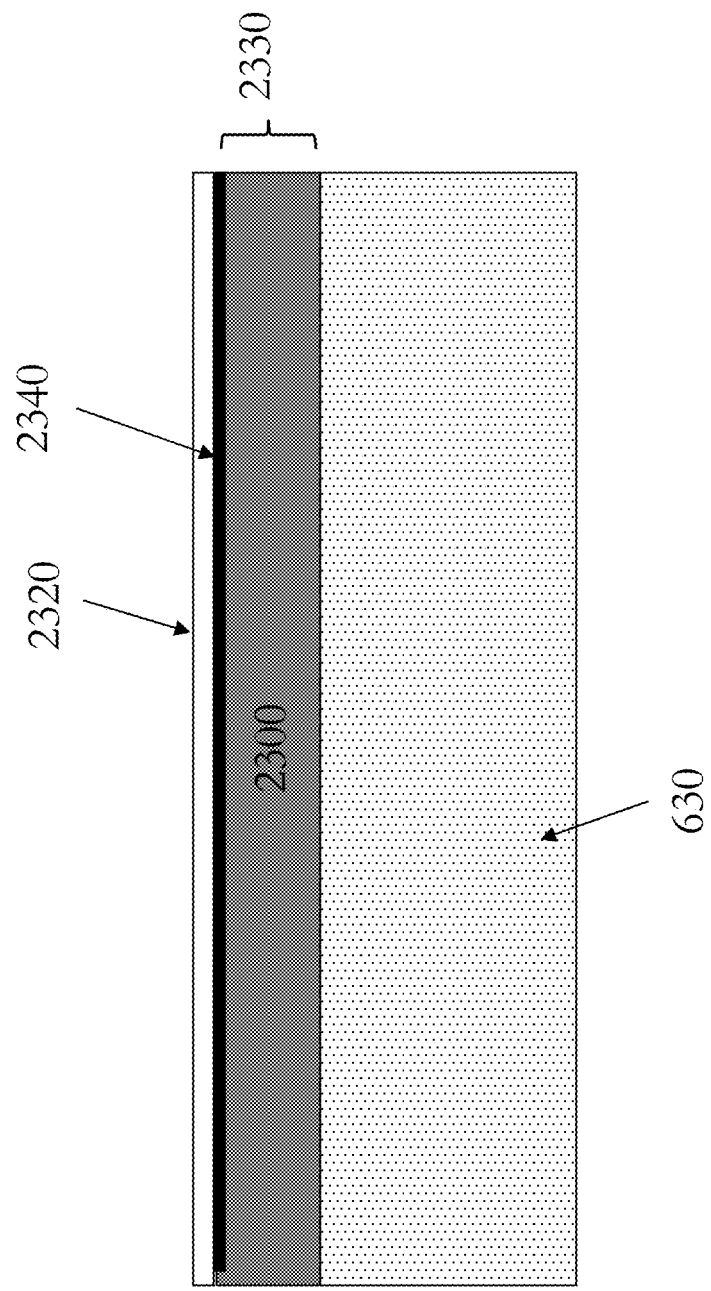
FIG. 21 is a cross-sectional view of an electrostatic chuck according to one embodiment of the present invention.

FIGS. 20 and 21 show the clamping electrode (2340) has no electrical insulator interposed between the clamping electrode (2340) and the material to be clamped (2320). In the case where the ESCs clamping electrode (2340) is exposed (not covered by an electrical insulator) and the clamping electrode (2340) is at least in partial contact with the material to be clamped (2320), the bottom surface of the material to be clamped (2320) that is in contact with the ESC electrode (2340) must be electrically insulating.

Figure 22:
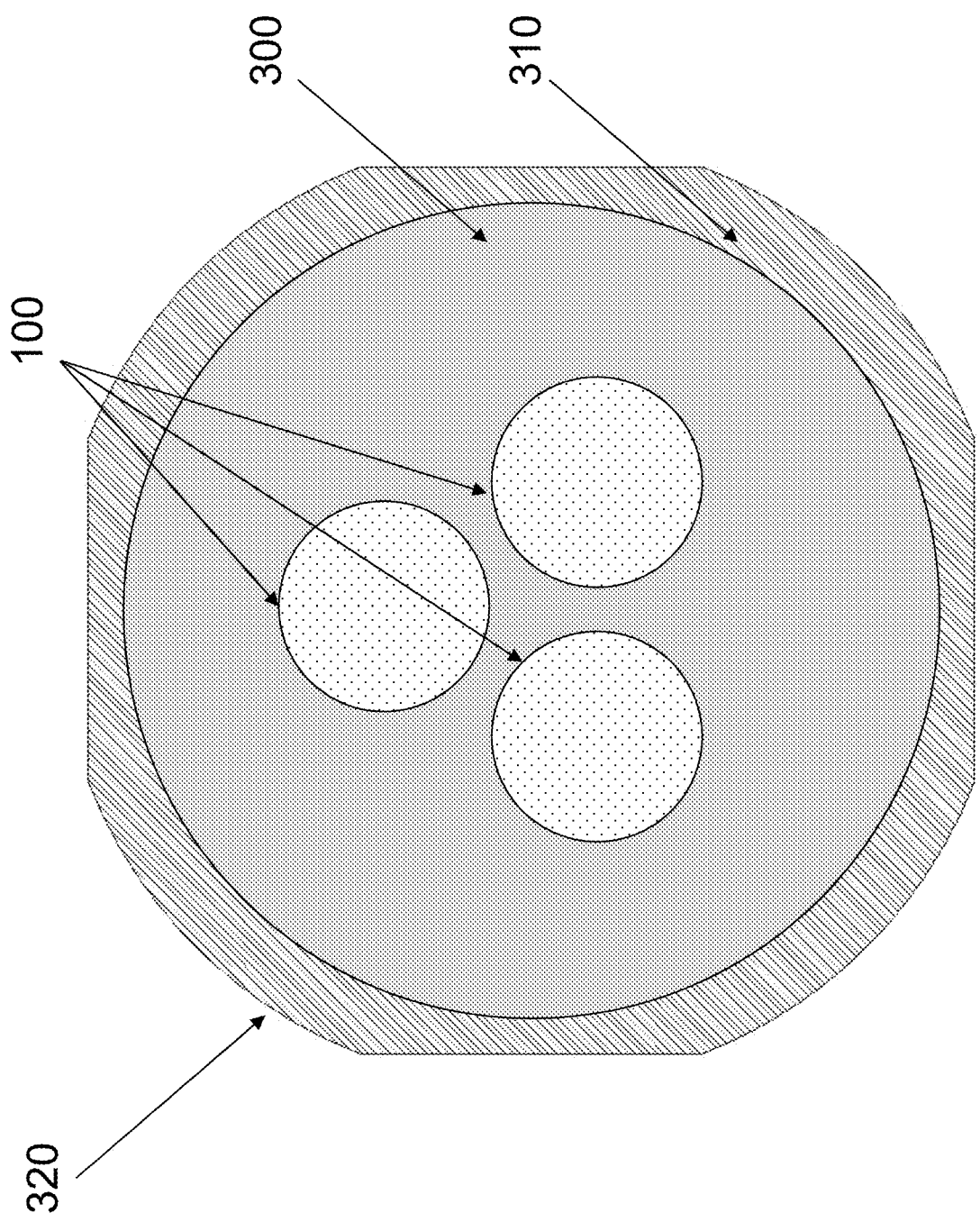
FIG. 22 is a top view of a work piece with multiple substrates according to one embodiment of the present invention.

In the case where the work piece (320) contains more than one substrate (100) as shown in FIG. 22, it is preferred that the ESC (670) extends beyond the edge of at least one substrate (100)—preferably extending beyond the edges of all substrates (100). In order to confine the cooling gas (typically helium) behind the substrates, the tape (300) must form a sealing surface between the electrostatic chuck (670) and the tape (300). This sealing surface is often called a seal band (1700). In one embodiment, the sealing surface (1700) is continuous and forms a region that circumscribes all the substrates (100). In another embodiment, the sealing band (1700) may be discontinuous and circumscribes at least one substrate. In yet another embodiment, each substrate (100) is circumscribed by an individual seal band (1700). In a further embodiment, the substrates (100) may overlay the sealing band(s) or alternatively, the sealing band(s) may lie outside the substrate(s) (100).

Figure 24:
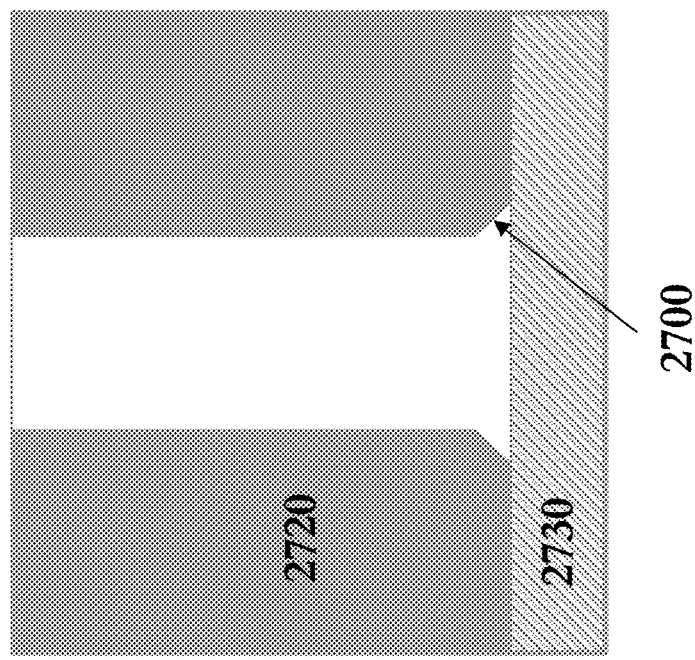
FIG. 24 is a cross sectional view of etched features according to one embodiment of the present invention.

As shown in FIG. 24, when etching a substrate down to an interface, defined by the contact of two materials (e.g., 2720 and 2730 in FIG. 24) of different relative dielectric constants (e.g., silicon on insulator, SOI structures), problems with the etch associated with charging at the interface, are well known. Such problems can be electrical or physical and are commonly known as notching (e.g., see 2700 in FIG. 23), trenching, feature profile degradation. Interface examples where these problems typically occur are Silicon-on-Insulator (SOI), semiconductor substrate mounted on insulating carriers, semiconductor wafers (e.g., GaAs, Si) mounted on tape, and substrates containing at least one electrically insulating layer. These problems are undesirable for device yield and performance. For example, when etching silicon using a time division multiplexed (e.g., TDM, DRIE or Bosch) process stopping on an insulator (e.g., $SiO_2$) it is known in the art that undercut (or notching) will occur at the silicon/insulator interface.

In any embodiment according to the present invention for a method for plasma dicing a substrate, the substrate is provided with a top surface and a bottom surface, the top surface of the substrate having a plurality of street areas and at least one device structure. The at least one of the plurality of streets of the substrate can intersect at an edge of the substrate. At least one street can be disposed between at least two devices. At least one street can surround the perimeter of at least one die. At least one street can surround the perimeter of most die. The streets can be positioned between a process control monitor and the device. There can be multiple devices on the substrate. The device can be on the front side of substrate or both sides of the substrate.

In any embodiment according to the present invention for a method for plasma dicing a substrate, the at least one device structure on the substrate can be protected during the processing step. The protection can be provided by a photoresist mask, a hardmask, a trilayer mask, a laser grooved (ablated) mask, a mechanically defined mask, a saw defined mask, a scribe defined mask, and/or a water soluble mask (Hogomax). The protection layer can be a part of the device structure such as device passivation layers, bonding pads, interlayer dielectrics and/or a back-metal layer. The protection can be achieved by a device structure and an applied mask layer(s).

In any embodiment according to the present invention for a method for plasma dicing a substrate, the substrate is placed onto a support film on a frame to form a work piece. The substrate or multiple substrates can be adhered to the support film. The substrates can be of the same material or the substrates can be of a different material. The substrates can be the same size or a different size. The substrates can be the same thickness or a different thickness. The substrate can be adhered on the side opposite the devices or the substrate can be adhered to the device side facing the tape.

In any embodiment according to the present invention for a method for plasma dicing a substrate, the support film can further comprise a carbon containing layer, can be polymeric, can be elastic, can be dicing tape or grinding tape. The support film can further comprise a plurality of layers. The support film can further comprise an adhesive layer. The adhesive layer can further comprise an acrylic based adhesive, a rubber-based adhesive, a UV release adhesive, and/or a thermal release adhesive. The adhesive layer can be between approximately 5-200 microns thick. The support film may contain a base layer. The base layer can further comprise polyolefin, PVC (polyvinyl chloride), EVA (Ethylene vinyl acetate), Polyethylene, Polyester-PET (Polyethylene terephthalate) and/or polyimide. The support film may contain a release layer and/or an anti-static layer. The support film's composition can change as a function of the support film's thickness. The support film can contain a region with a graded composition (composition changes as a function of film thickness in a non-discrete manner). The support film can be designed to withstand temperatures of approximately 60 degrees Celsius or temperatures up to approximately 300 degrees Celsius.

In any embodiment according to the present invention for a method for plasma dicing a substrate, the frame of the work piece can have a conductive layer and/or a metal layer. The frame can be adhered to the support film. The support film can overlap the frame, the support film can completely overlap the frame and/or the support film may not extend past the outer diameter of the frame. The frame can be rigid. The frame can be made of metal, hardened magnetic stainless, electro-polished and/or a resin (e.g., Acrylonitrile butadiene styrene). The frame can be approximately 1-5 mm thick. The substrate can be positioned so that there is no overlap of the substrate and the frame. The inner diameter of the frame can be greater than the outer diameter of the substrate. The substrate can be indexed to the frame translationally and/or rotationally. The outer diameter of the frame can contain index features and/or the inner diameter of the frame can contain index features. The substrate and the frame can be concentric.

In any embodiment according to the present invention for a method for plasma dicing a substrate, a process chamber having a plasma source is provided. The plasma source can be a high density plasma source. A work piece support is provided within the plasma process chamber. An electrostatic chuck can be incorporated into the work piece support. The work piece is placed onto the work piece support. An RF power source can be coupled to the work piece support to create a plasma around the work piece. A thermal communication between the work piece and the work piece support can be provided by supplying a pressurized gas such as helium from the work piece support to the work piece.

In any embodiment according to the present invention for a method for plasma dicing a substrate, a plasma is generated from the plasma source in the plasma process chamber. The entire work piece can be exposed to the generated plasma and/or the entire substrate can be exposed to the generated plasma. The exposure of the support film to the generated plasma can modify the support film composition. The exposure of the support film to the generated plasma can deposit material onto the support film. The exposure of the support film to the generated plasma can chemically modify the support film. The exposure of the support film to the generated plasma can thin the support film. The exposure of the support film to the generated plasma can etch the support film.

In any embodiment according to the present invention for a method for plasma dicing a substrate, at least a portion of the support film that is overlapped by the substrate is not exposed to the generated plasma. A portion of the support film outside the perimeter of the substrate can be exposed to the generated plasma. The support film outside the perimeter of the substrate can be exposed to the generated plasma. A portion of the support film adjacent to the perimeter of the substrate can be exposed to the generated plasma. The support film adjacent to the perimeter of the substrate can be exposed to the generated plasma. A portion of the support film overlapped by the workpiece support can be exposed to the plasma. The support film overlapped by the workpiece support can be exposed to the plasma. A portion of the support film surface not in contact with the work piece support can be exposed to the plasma. The support film that can be overlapped by the frame can be exposed to the generated plasma. The support film that can be overlapped by the frame may not be exposed to the generated plasma. A portion of the support film inside the inner diameter of the frame can be exposed to the generated plasma. The support film inside the inner diameter of the frame can be exposed to the generated plasma. A portion of the support film that is adjacent to the inner diameter of the frame can be exposed to the generated plasma. The support film that is adjacent to the inner diameter of the frame can be exposed to the generated plasma. The support film can remain intact during the exposure to the generated plasma. The support film can be suitable for an expansion operation post exposure to the generated plasma. The support film can be etched prior to the substrate being exposed to the generated plasma. The support film can be selectively etched faster than the substrate in a portion of the process. (e.g., the support film etch rate is greater than the substrate etch rate for at least a portion of the process). A layer of the support film can be thinned prior to the substrate being exposed to the generated plasma.

In any embodiment according to the present invention for a method for plasma dicing a substrate, the possible change in the support film composition can be detected during the exposure of the support film to the generated plasma. The support film surface composition can be monitored using radiation (e.g., light). The radiation can emitted from an external light source (e.g., laser or broad band light source). The radiation can be emitted from the plasma. The support film composition can be detected by optical emission spectrometry (OES), laser emission spectrometry (LES), optical emission interferometry (OEI). The process time required to change the support film composition can be predetermined. The possible change in the support film composition can change the substrate etch rate. The possible change in the support film composition can change the support film etch rate. The possible change in the support film composition can change the etch mask etch rate. The possible change in the support film composition can affect die sidewall profile. The possible change in the support film composition can increase etch anisotropy. The possible change in the support film composition can maintain vertical die sidewalls.

In one embodiment according to the present invention, the work piece is processed using the generated plasma and a byproduct generated from the support film while the support film is exposed to the generated plasma.

In another embodiment according to the present invention, a surface of the substrate of the work piece is etched using the generated plasma to removed material from the surface of the substrate and provide exposed surfaces. The etching step can have some degree of anistropy. The etching step can be anisotropic. A passivation layer comprising a byproduct generated from the support film that is exposed to the generated plasma is deposited onto the surfaces that were exposed in the etching step. A reaction byproduct from the support film can be deposited on the substrate. A byproduct from the support film can contribute to the anisotropy of an etched feature in the substrate. A byproduct from the support film can be deposited on a feature sidewall etched into the substrate. The anisotropy of the etched feature in the substrate can be adjusted by adjusting the support film etch rate. The etch rate of the support film can be changed during the course of the process in order to modify and/or maintain a desired etch feature profile in the substrate. The etch rate of the support film can be adjusted by adjusting plasma process parameters. The etch rate of the support film may be adjusted nearly independently of the substrate etch rate. In a case where the substrate contains a compound semiconductor (e.g., Group III-V semiconductors including GaAs, InP, AlGaAs, etc.) the support film etch rate can be adjusted by adjusting the RF bias applied to the work piece. For example, when etching GaAs in a chlorine-containing process, increasing the RF bias on the work piece significantly increases the support film etch rate with only a modest effect on the GaAs etch rate. The etch rate of GaAs for plasma dicing can be from tenths of microns per minute to over 50 microns per minute. The support film etch rates typically range from 0.01 micron per minute to tens of microns per minute. The selectivity of GaAs:support film (ratio of etch rate of GaAs to etch rate of support film) can range from near 1:1 up to approximately 100:1. Typical etch rate selectivities of GaAs to support film can be near 10:1. Decreasing the GaAs:support film etch selectivity typically provides more sidewall passivation to features etched into a GaAs substrate. In other words, lowering the GaAs:support film selectivity can increase the anisotropy of the GaAs etch. In another embodiment, a change in the composition of the support film may effect the etch performance on the substrate. A change in support film composition may effect the etch rate of the substrate material. A change in support film composition may affect the degree of anisotropy of features etched into the substrate. In a case where the support film consists of more than one layer, it can be beneficial to modify the etch process in response to a change in the support film composition. For example, when plasma dicing a GaAs-containing substrate on a support film it can be beneficial to modify the plasma process conditions based on the support film composition. GaAs can be etched using chlorine containing processes. Processes can contain $Cl_2$ as a chlorine source and may contain additives to help with etch anisotropy or surface topology (e.g., surface roughness). Typical additives include hydrogen-containing gases (e.g., $H_2$, HCl, HBr, HI, $CH_4$, etc.), nitrogen-containing gases (e.g., $N_2$ and $NH_4$, etc.), boron containing gases (e.g., $BCl_3$, $BF_3$, $BBr_3$, etc.), silicon containing gases (e.g., $SiCl_4$, etc.), carbon containing gases (e.g., $CCl_4$, $CHCl_3$, $C_xH_yCl_z$, etc.), or inert gases (Ar, He, Kr, Xe, etc.), and oxygen-containing gases (e.g., $O_2$, $N_2O$, CO, $CO_2$, $H_2O$, $NO_2$, $SO_2$, etc.). The inventors have observed that while etching a GaAs containing substrate on a support film (e.g., dicing tape that contains an acrylic containing adhesive layer over a film base layer) using a chorine-containing plasma etch process (e.g., $BCl_3$/$Cl_2$ based process) that the GaAs etch rate decreases dramatically once a portion of the adhesive layer of the support film has been consumed by the plasma. The etch rate of the GaAs substrate decreases as a portion of the base layer of the film is exposed to the plasma. The base layer of the film can contain polyethylene terephthalate (PET). The depletion of the adhesive layer during a plasma process can be detected using optical emission spectrometry. As the adhesive layer of the dicing tape is depleted, a decrease in the GaAs etch rate can be mitigated by increasing the concentration (e.g., flow rate) of an oxygen-containing process gas. Increasing the concentration of an oxygen-containing process gas can increase the GaAs etch rate. In a preferred embodiment, the oxygen-containing gas is injected into the plasma chamber using a gas injector that is separate from the gas introduction used for another process gas. In a preferred embodiment, the oxygen containing gas is introduced into the plasma chamber independently from a boron-containing process gas (e.g., $BCl_3$). In another preferred embodiment, the oxygen containing gas is introduced into the plasma chamber independently from the a silicon-containing process gas (e.g., $SiCl_4$).

Figure 25:
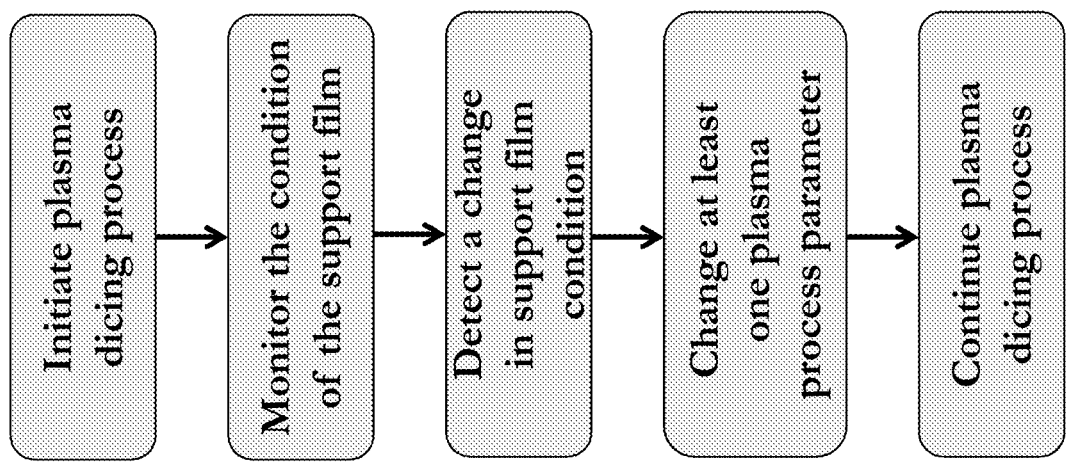
FIG. 25 is a flowchart of one embodiment of the present invention.

A general form of this embodiment is illustrated in FIG. 25. A plasma process is initiated on a workpiece (e.g., at least one substrate mounted on a support film with a frame), the condition of the support film is monitored during the plasma process (e.g., by monitoring the emission intensity of the plasma at least one wavelength. In a preferred embodiment, the wavelength can be associated with an oxygen-containing molecule), detecting a change in the condition of the support film during the plasma process (e.g., depletion of an adhesive layer in the film exposing a base layer), modifying at least one plasma parameter in response to the detected change in the support film condition (e.g., changing the composition of the process feed gas. In a preferred embodiment increasing the concentration of at least one oxygen-containing process gas) and continuing the plasma process.

In another embodiment according to the present invention a surface of the substrate of the work piece is etched using a plasma etch gas and a byproduct generated from the support film that is exposed to the generated plasma to removed material from the surface of the substrate and provide exposed substrate surfaces.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method of dicing a substrate, the method comprising:
providing a plasma process chamber having a plasma source;
providing a work piece support within the plasma process chamber;
providing the substrate;
placing the substrate onto a support film on a frame to form a work piece;
placing the work piece onto said work piece support;
generating a plasma from the plasma source in the plasma process chamber;
exposing at least a portion of the support film that is not overlapped by the substrate to the generated plasma;
generating a byproduct from the exposed portion of the support film; and
processing the work piece using the generated plasma and the byproduct generated from the exposed portion of the support film.

2. The method according to claim 1 wherein the substrate further comprising a compound semiconductor.

3. The method according to claim 1 further comprising monitoring a change in a composition of the support film during the exposure of the support film to the generated plasma.

4. The method according to claim 3 further comprising modifying the processing of the work piece based on the composition of the support film.

5. The method according to claim 1 wherein the substrate is adhered to the support film.

6. The method according to claim 5 wherein the support film further comprising a carbon containing layer.

7. The method according to claim 1 wherein the support film further comprising a plurality of layers.

8. The method according to claim 7 wherein the support film further comprising an adhesive layer.

9. A method of dicing a substrate, the method comprising:
providing a plasma process chamber having a plasma source;
providing a work piece support within the plasma process chamber;
providing the substrate;
placing the substrate onto a support film on a frame to form a work piece;
placing the work piece onto said work piece support;
generating a plasma from the plasma source in the plasma process chamber;
exposing at least a portion of the support film that is not overlapped by the substrate to the generated plasma;
generating a byproduct from the exposed portion of the support film;
etching a surface of the substrate of the work piece using the generated plasma to remove material from the surface of the substrate and provide exposed surfaces; and
depositing a passivation layer comprising the byproduct generated from the support film that is exposed to the generated plasma onto the surfaces that were exposed in the etching step.

10. The method according to claim 9 wherein the etch step is an anisotropic etch.

11. The method according to claim 9 wherein the substrate further comprising a compound semiconductor.

12. The method according to claim 9 further comprising monitoring a change in a composition of the support film during the exposure of the support film to the generated plasma.

13. The method according to claim 12 further comprising modifying the processing of the work piece based on the composition of the support film.

14. The method according to claim 9 wherein the substrate is adhered to the support film.

15. The method according to claim 14 wherein the support film further comprising a carbon containing layer.

16. The method according to claim 9 wherein the support film further comprising a plurality of layers.

17. The method according to claim 16 wherein the support film further comprising an adhesive layer.

18. A method of dicing a substrate, the method comprising:
providing a plasma process chamber having a plasma source;
providing a work piece support within the plasma process chamber;
providing the substrate;

placing the substrate onto a support film on a frame to form a work piece;

placing the work piece onto said work piece support;

generating a plasma from the plasma source in the plasma process chamber;

exposing at least a portion of the support film that is not overlapped by the substrate to the generated plasma;

generating a byproduct from the exposed portion of the support film; and etching a surface of the substrate of the work piece using a plasma etch gas and the byproduct generated from the support film that is exposed to the generated plasma to remove material from the surface of the substrate and provide exposed surfaces.

19. The method according to claim 18 wherein the substrate further comprising a compound semiconductor.

20. The method according to claim 18 further comprising monitoring a change in a composition of the support film during the exposure of the support film to the generated plasma.

21. The method according to claim 18 wherein further comprising modifying the processing of the work piece based on the composition of the support film.

22. The method according to claim 18 wherein the substrate is adhered to the support film.

23. The method according to claim 22 wherein the support film further comprising a carbon containing layer.

24. The method according to claim 18 wherein the support film further comprising a plurality of layers.

25. The method according to claim 24 wherein the support film further comprising an adhesive layer.

26. A method of dicing a substrate, the method comprising:

providing a plasma process chamber having a plasma source;

providing a work piece support within the plasma process chamber;

providing the substrate;

placing the substrate onto a support film on a frame to form a work piece;

placing the work piece onto said work piece support;

generating a plasma from the plasma source in the plasma process chamber;

exposing at least a portion of the support film that is not overlapped by the substrate to the generated plasma;

processing the work piece using the generated plasma;

monitoring a support film composition during the processing step;

detecting a change in the support film composition during the processing step; and modifying the work piece processing step based on the detection step.

* * * * *